(12) United States Patent
Moon et al.

(10) Patent No.: US 12,395,139 B2
(45) Date of Patent: Aug. 19, 2025

(54) ELECTRONIC DEVICE AND METHOD FOR AMPLIFYING TRANSMISSION SIGNAL IN TIME DIVISION DUPLEX SCHEME

(71) Applicant: SAMSUNG ELECTRONICS CO., LTD., Suwon-si (KR)

(72) Inventors: Junghwan Moon, Suwon-si (KR); Youngyoon Woo, Suwon-si (KR); Minsik Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/380,460

(22) Filed: Oct. 16, 2023

(65) Prior Publication Data
US 2024/0204737 A1 Jun. 20, 2024

Related U.S. Application Data

(63) Continuation of application No. PCT/KR2023/014323, filed on Sep. 20, 2023.

(30) Foreign Application Priority Data

Dec. 19, 2022 (KR) .......................... 10-2022-0178358
Jan. 30, 2023 (KR) .......................... 10-2023-0012155

(51) Int. Cl.
*H03F 3/24* (2006.01)
*H03F 1/32* (2006.01)
*H04B 1/04* (2006.01)

(52) U.S. Cl.
CPC ........... *H03F 3/245* (2013.01); *H03F 1/3241* (2013.01); *H04B 1/0475* (2013.01); *H03F 2200/451* (2013.01); *H04B 2001/0425* (2013.01)

(58) Field of Classification Search
CPC .. H03F 3/245; H03F 1/3241; H03F 2200/451; H04B 1/0475; H04B 2001/0425
(Continued)

(56) References Cited

U.S. PATENT DOCUMENTS 6,330,455 B1   12/2001   Ichihara
6,751,447 B1   6/2004    Jin et al.
(Continued)

FOREIGN PATENT DOCUMENTS

CN   103974395 A   8/2014
CN   111669134 A   9/2020
(Continued)

OTHER PUBLICATIONS

International Search Report (PCT/ISA/210) issued on Jan. 17, 2024 by the International Searching Authority in International Application No. PCT/KR2023/014323.

*Primary Examiner* — Kevin M Burd
(74) *Attorney, Agent, or Firm* — Sughrue Mion, PLLC

(57) ABSTRACT

An electronic device may include: a processor; a power amplifier; a power supply configured to supply power to the power amplifier; a crest factor reduction (CFR) module; and a digital predistortion (DPD) module, wherein the processor is configured to: transmit a first radio frequency (RF) signal, based on a first state of each of the CFR module, the DPD module, and the power supply, in a first transmission interval, the first RF signal being generated from a first baseband signal; identify voltage information of a second RF signal associated with a second transmission interval after the first transmission interval; change a state of each of the CFR module, the DPD module, and the power supply from the first state to a second state, based on the voltage information, in a first reception interval between the first transmission interval and the second transmission interval; and transmit the second RF signal generated from a second baseband
(Continued)

signal based on the second state of each of the CFR module, the DPD module, and the power supply, in the second transmission interval.

20 Claims, 9 Drawing Sheets

(58) Field of Classification Search
USPC ......................................................... 375/287
See application file for complete search history.

(56) References Cited

U.S. PATENT DOCUMENTS

| | | |
|---|---|---|
| 8,649,746 B2 | 2/2014 | Kang et al. |
| 8,908,751 B2 | 12/2014 | Camuffo et al. |
| 9,467,954 B2 | 10/2016 | Cao et al. |
| 10,153,741 B2 | 12/2018 | Yang et al. |
| 2005/0105642 A1* | 5/2005 | Muller .................. H03F 1/3241 375/296 |
| 2021/0067386 A1* | 3/2021 | Cova ................. H04L 25/03343 |
| 2022/0385515 A1* | 12/2022 | Kutz .................... H04L 27/2623 |

FOREIGN PATENT DOCUMENTS

| | | |
|---|---|---|
| CN | 214045580 U | 8/2021 |
| KR | 10-0700102 B1 | 3/2007 |
| KR | 10-2012-0098506 A | 9/2012 |
| KR | 10-2012-0124106 A | 11/2012 |
| KR | 10-2013-0031465 A | 3/2013 |
| KR | 10-1436926 B1 | 9/2014 |
| KR | 10-1664718 B1 | 10/2016 |
| KR | 10-2016-0126610 A | 11/2016 |
| WO | 2019/190551 A1 | 10/2019 |

* cited by examiner

ELECTRONIC DEVICE AND METHOD FOR AMPLIFYING TRANSMISSION SIGNAL IN TIME DIVISION DUPLEX SCHEME

CROSS-REFERENCE TO RELATED APPLICATIONS

This application is a by-pass continuation application of International Application No. PCT/KR2023/014323, filed on Sep. 20, 2023, which is based on and claims priority to Korean Patent Application Nos. 10-2022-0178358, filed on Dec. 19, 2022, and 10-2023-0012155, filed on Jan. 30, 2023, in the Korean Intellectual Property Office, the disclosures of which are incorporated by reference herein their entireties.

BACKGROUND

1. Field

The disclosure relates to an electronic device and method for amplifying a transmission signal in a time division duplex (TDD) scheme.

2. Description of Related Art

An electronic device may include a power amplifier, in order to transmit an output signal in a radio frequency (RF) band. The electronic device may generate a baseband signal and a RF signal that is carried over the RF band. The electronic device may transmit the generated RF signal to an external electronic device, by amplifying the generated RF signal through a power amplifier. The electronic device may also include a power supply to supply power to the power amplifier that amplifies the RF signal.

SUMMARY

According to an aspect of the disclosure, an electronic device may include: a processor; a power amplifier; a power supply configured to supply power to the power amplifier; a crest factor reduction (CFR) module; and a digital predistortion (DPD) module, wherein the processor is configured to: transmit a first radio frequency (RF) signal, based on a first state of each of the CFR module, the DPD module, and the power supply, in a first transmission interval, the first RF signal being generated from a first baseband signal; identify voltage information of a second RF signal associated with a second transmission interval after the first transmission interval; change a state of each of the CFR module, the DPD module, and the power supply from the first state to a second state, based on the voltage information, in a first reception interval between the first transmission interval and the second transmission interval; and transmit the second RF signal generated from a second baseband signal based on the second state of each of the CFR module, the DPD module, and the power supply, in the second transmission interval.

The processor may be further configured to: identify a control signal for changing from the first state to the second state; and based on the control signal, change a state of the CFR module, a state of the DPD module, and a state of the power supply. The control signal may include: information on a voltage corresponding to a maximum average power of the first RF signal and a voltage corresponding to a maximum average power of the second RF signal, and length information of the second transmission interval.

The processor may be further configured to: identify first scheduling information for transmitting the first RF signal, and identify second scheduling information for transmitting the second RF signal. The maximum average power of the first RF signal may be identified based on the first scheduling information. The maximum average power of the second RF signal may be identified based on the second scheduling information.

The electronic device may include a digital unit (DU) and a radio unit (RU). The DU may be configured to provide the control signal to the RU.

The processor may be further configured to: identify a first in-phase/quadrature-phase (I/Q) data in the first baseband signal, and identify a second I/Q data in the second baseband signal. The maximum average power of the first RF signal may be identified based on the first I/Q data. The maximum average power of the second RF signal may be identified based on the second I/Q data.

The processor may be further configured to: identify another voltage information of a third RF signal associated with a third transmission interval after the second transmission interval, change the state of each of the CFR module, the DPD module, and the power supply from the second state to a third state, based on the other voltage information of the third RF signal, in a second reception interval between the second transmission interval and the third transmission interval, and transmit the third RF signal, based on the third state of each of the CFR module, the DPD module, and the power supply, in the third transmission interval. The third RF signal may be generated from a third baseband signal. A length of the first reception interval and the second transmission interval may be different from a length of the second reception interval and the third transmission interval.

The processor may be further configured to: set a threshold of the CFR module in the first state to a first value; and set the threshold of the CFR module in the second state to a second value based on the voltage information of the second RF signal.

The DPD module may include a plurality of look-up table (LUT)s. The processor may be further configured to: set a LUT of the DPD module in the first state to a first LUT of the plurality of LUTs, and set the LUT of the DPD module in the second state to a second LUT of the plurality of LUTs based on the voltage information of the second RF signal.

The processor may be further configured to: set a direct current supplied by the power supply in the first state to a first voltage, and set the direct current supplied by the power supply in the second state to a second voltage based on the voltage information of the second RF signal.

The processor may be further configured to: transmit the first RF signal by amplifying using the power amplifier corresponding to the first state, and transmit the second RF signal by amplifying using the power amplifier corresponding to the second state.

According to an aspect of the disclosure, a method performed by an electronic device, includes: transmitting a first radio frequency (RF) signal, based on a first state of each of a crest factor reduction (CFR) module, a digital predistortion (DPD) module, and a power supply for a power amplifier of the electronic device, in a first transmission interval, the first RF signal being generated from a first baseband signal; identifying voltage information of a second RF signal associated with a second transmission interval after the first transmission interval; changing a state of each of the CFR module, the DPD module, and the power supply from the first state to a second state, based on the voltage information, in a first reception interval between the first transmission interval and the second transmission interval; and transmitting the second RF signal, based on the second state of each of the CFR module, the DPD module, and the power supply, in the second transmission interval, the second RF signal being generated from a second baseband signal.

The method may further include: identifying a control signal for changing from the first state to the second state; and changing a state of each of the CFR module, a state of the DPD module, and a state of the power supply based on the control signal. The control signal may include: information on a voltage corresponding to a maximum average power of the first RF signal and a voltage corresponding to a maximum average power of the second RF signal, and length information of the second transmission interval.

The method may further include: identifying first scheduling information for transmitting the first RF signal, and identifying second scheduling information for transmitting the second RF signal. The maximum average power of the first RF signal may be identified based on the first scheduling information. The maximum average power of the second RF signal may be identified based on the second scheduling information.

The electronic device may include a digital unit (DU) and a radio unit (RU), and the DU may be configured to provide the control signal to the RU.

The method may further include: identifying a first in-phase/quadrature-phase (I/Q) data in the first baseband signal, and identifying a second I/Q data in the second baseband signal, the maximum average power of the first RF signal may be identified based on the first I/Q data, and the maximum average power of the second RF signal may be identified based on the second I/Q data.

The method may further include: identifying another voltage information of a third RF signal associated with a third transmission interval after the second transmission interval, changing the state of each of the CFR module, the DPD module, and the power supply from the second state to a third state, based on the other voltage information of the third RF signal, in a second reception interval between the second transmission interval and the third transmission interval, and transmitting the third RF signal, based on the third state of each of the CFR module, the DPD module, and the power supply, in the third transmission interval, the third RF signal being generated from a third baseband signal, and a length of the first reception interval and the second transmission interval may be different from a length of the second reception interval and the third transmission interval.

The method may further include: setting a threshold of the CFR module in the first state to a first value; and setting the threshold of the CFR module in the second state to a second value based on the voltage information of the second RF signal.

The DPD module may include a plurality of look-up table (LUT)s. The method may further include: setting a LUT of the DPD module in the first state to a first LUT of the plurality of LUTs, and setting the LUT of the DPD module in the second state to a second LUT of the plurality of LUTs based on the voltage information of the second RF signal.

The method may further include: setting a direct current voltage supplied by the power supply in the first state to a first voltage, and setting the direct current voltage supplied by the power supply in the second state to a second voltage based on the voltage information of the second RF signal.

The method may further include: transmitting the first RF signal by amplifying using the power amplifier corresponding to the first state, and transmitting the second RF signal by amplifying using the power amplifier corresponding to the second state.

BRIEF DESCRIPTION OF THE DRAWINGS

The above and other aspects, features, and advantages of certain embodiments of the disclosure will be more apparent from the following description taken in conjunction with the accompanying drawings, in which.

With respect to the description of the drawing, the same or similar reference numeral may be used for the same or similar component.

DETAILED DESCRIPTION

Figure 1A:
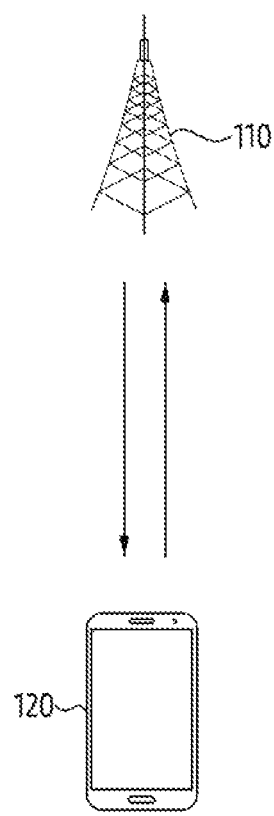
FIG. 1A illustrates an example of a wireless communication system.

Before undertaking the detailed description below, it may be advantageous to set forth definitions of certain words and phrases used throughout the disclosure. The terms "transmit", "receive", and "communicate" as well as the derivatives thereof encompass both direct and indirect communication. The terms "include" and "comprise", and the derivatives thereof refer to inclusion without limitation. The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. Similarly, the term "set" means one or more. Accordingly, the set of items may be a single item or a collection of two or more items.

Terms used in the disclosure are used only to describe a specific embodiment, and may not be intended to limit the scope of another embodiment. A singular expression may include a plural expression unless it is clearly meant differently in the context. The terms used herein, including a technical or scientific term, may have the same meaning as generally understood by a person having ordinary knowledge in the technical field described in the disclosure. Terms defined in a general dictionary among the terms used in the disclosure may be interpreted with the same or similar meaning as a contextual meaning of related technology, and unless clearly defined in the disclosure, it is not interpreted in an ideal or excessively formal meaning. In some cases, even terms defined in the disclosure cannot be interpreted to exclude embodiments of the disclosure.

In one or more embodiments of the disclosure described below, a hardware approach is described as an example. However, since the one or more embodiments of the disclosure include technologies that use both hardware and software, the one or more embodiments of the disclosure do not exclude a software-based approach.

A term (line, transmission line, feeding line, power amplifier, crest factor reduction (CFR) module, digital predistortion (DPD) module, modem, and the like) and the like referring to a component of a device used in the following description is exemplified. Accordingly, the disclosure is not limited to terms described below, and another term having an equivalent technical meaning may be used. In addition, a term such as '... unit', '... er', '... material', '... body', and the like used below may mean at least one shape structure, or may mean a unit that processes a function.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'. In addition, hereinafter, 'A' to 'B' means at least one of elements from A (including A) and to B (including B).

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1A illustrates an example of a wireless communication system.

FIG. 1A illustrates the wireless communication system according to embodiments of the disclosure. FIG. 1A illustrates a base station 110 and a terminal 120 as a portion of nodes using a wireless channel in the wireless communication system. FIG. 1A illustrates only one base station, but another base station which is the same or similar to the base station 110 may be further included.

The base station 110 is a network infrastructure that provides wireless access to the terminal 120. The base station 110 has coverage defined as a certain geographic area based on a distance capable of transmitting a signal. In addition to the base station, the base station 110 may be referred to as 'access point (AP)', 'eNodeB (eNB)', '5th generation node (5G node)', 'wireless point', 'transmission/reception point (TRP)', or another term having equivalent technical meaning thereto.

The terminal 120 is a device used by a user and performs communication with the base station 110 through the wireless channel. In some cases, the terminal 120 may be operated without user involvement. In other words, the terminal 120 is a device that performs machine type communication (MTC) and may not be carried by the user. In addition to the terminal, the terminal 120 may be referred to as 'user equipment (UE)', 'mobile station', 'subscriber station', 'customer premises equipment (CPE)', 'remote terminal', 'wireless terminal', 'electronic device', or 'user device', or another term having equivalent technical meaning thereto.

In the related art, in a communication system in which the cell radius of the base station is relatively large, each base station was installed so that each base station included functions of digital processing unit (or distributed unit (DU)) and radio frequency (RF) processing unit (or radio unit (RU)). However, as a high frequency band is used in $4^{th}$ generation (4G) and/or subsequent communication systems (e.g., 5G), and cell coverage of the base station decreases, the number of base stations for covering a specific area has increased. The burden of installation cost for an operator for installing the base stations has also increased. In order to reduce the installation cost of the base station, a structure in which the DU and RU of the base station are separated, one or more RUs are connected to one DU through a wired network, and one or more geographically distributed RUs are disposed for covering the specific area has been proposed. Hereinafter, a deployment structure and extension examples of the base station according to one or more embodiments of the disclosure will be described with reference to FIG. 2.

Figure 1B:
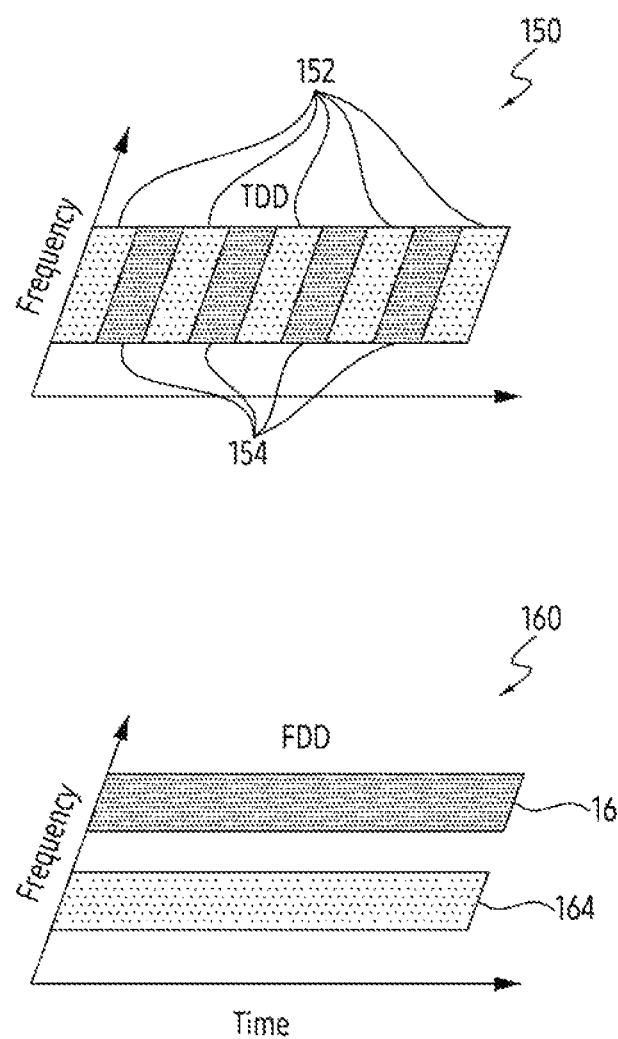
FIG. 1B illustrates an example for explaining a resource division scheme for uplink transmission and downlink transmission.

FIG. 1B illustrates an example for explaining a resource division scheme for uplink transmission and downlink transmission. The resource division scheme may include frequency division duplex (FDD) and time division duplex (TDD).

FIG. 1B illustrates an example of a method of transmitting and receiving a signal including data between a base station 110 and a terminal 120 of FIG. 1A. For example, the signal may include an orthogonal frequency division multiplexing (OFDM) signal.

Referring to FIG. 1B, in downlink (DL) transmission that the base station 110 transmits to the terminal 120 and uplink (UL) transmission that the terminal 120 transmits to the base station 110, examples 150 and 160 of a method of dividing a resource used to transmit and receive the data are illustrated. The example 150 may indicate an example of a time division duplex (TDD) scheme, which is a method of dividing the resource for DL transmission and the resource for UL transmission according to time. The example 160 may indicate an example of an FDD scheme, which is a method of dividing the resource for DL transmission and the resource for UL transmission according to frequency.

Referring to the example 150, the base station 110 may transmit DL signals to the terminal 120 through DL resources 152. The terminal 120 may receive the DL signals transmitted from the base station 110 through the DL resources 152. The terminal 120 may transmit UL signals to the base station 110 through UL resources 154. The base station 110 may receive the UL signals transmitted from the terminal 120 through the UL resources 154. Referring to the example 150, a different time resource may be allocated to the DL resources 152 and the UL resources 154. The DL transmission that the base station 110 transmits to the terminal 120 and the UL transmission that the terminal 120 transmits to the base station 110, may be performed in a different time domain. The example 150 illustrates an example in which a time resource of the same length is allocated to each resource of the DL resources 152 and the UL resources 154, but embodiments of the disclosure are not limited thereto. For example, a time resource of a different length may be allocated to each resource of the DL resources 152 and the UL resources 154. In other words, a period for the downlink transmission may be set differently from a period for the uplink transmission. Alternatively, the time resource of the different length may be allocated to both the DL resources 152 and the UL resources 154. In other words, the downlink transmission and the uplink transmission may be transmitted aperiodically. In one embodiment, in the example 150, a guard period may be included between the DL resources 152 and the UL resources 154.

Referring to the example 160, the base station 110 may transmit the DL signals to the terminal 120 through DL resources 162. The terminal 120 may receive the DL signals transmitted from the base station 110 through the DL resources 162. The terminal 120 may transmit UL signals to the base station 110 through UL resources 164. The base station 110 may receive the UL signals transmitted from the terminal 120 through the UL resources 164. Referring to the example 160, a different frequency resource may be allocated to the DL resources 162 and the UL resources 164. In other words, the DL transmission that the base station 110 transmits to the terminal 120 and the UL transmission that the terminal 120 transmits to the base station 110 may be performed in a different frequency domain. The example 160 illustrates an example in which a frequency resource for a band of the same size are allocated to each resource of the DL resources 162 and the UL resources 164, but embodiments of the disclosure are not limited thereto. For example, a frequency resource for a band of a different size may be allocated to each resource of the DL resources 162 and the UL resources 164.

Comparing the example 150 and the example 160, the DL resources 152 and the UL resources 154 may be allocated a wider band of frequency resource compared to the DL resources 162 and the UL resources 164. For example, the base station 110 or the terminal 120 of the example 150 may transmit a larger amount of data for the same time compared to the base station 110 or the terminal 120 of the example 160. In contrast, compared to the DL resources 152 and the UL resources 154, the DL resources 162 and the UL resources 164 are allocated a narrower band of frequency resources, but a time resource of a longer time interval may be allocated. For example, the base station 110 or the terminal 120 of the example 160 may transmit seamlessly (or continuously) compared to the base station 110 or the terminal 120 of the example 150.

In order to describe the TDD scheme in the embodiments of the disclosure, a resource structure of the TDD scheme defined in a communication standard (e.g., LTE or NR) is exemplarily described. According to an embodiment, the base station 110 and the terminal 120 may use the TDD scheme of the LTE. The TDD scheme of the LTE defines the time resource for downlink communication and the time resource for uplink communication in one wireless frame. The wireless frame may include a UL subframe for the UL transmission and a DL subframe for the DL transmission. The frame may include a special subframe (SSF) for switching from the downlink transmission to the uplink transmission. Here, a combination of the UL subframe, the DL subframe, and the special subframe included in one frame is referred to as a UL/DL configuration. Another UL/DL configuration indicates another combination of the UL subframe, the DL subframe, and the special subframe in one frame. The UL/DL configuration may be operated as shown in Table 1 below. In the Table 1 below, D indicates the DL subframe, S indicates the special subframe, and U indicates the UL subframe. For example, UL/DL configuration #2 may include 6 DL subframes, 2 UL subframes, and 2 special subframes, and UL/DL configuration #5 may include 8 DL subframes, 1 UL subframe, and 1 special subframe.

TABLE 1

| UL/DL configuration | Subframe number | | | | | | | | | | Number of each subframe | | |
|---|---|---|---|---|---|---|---|---|---|---|---|---|---|
| | 0 | 1 | 2 | 3 | 4 | 5 | 6 | 7 | 8 | 9 | DL | UL | S |
| 0 | D | S | U | U | U | D | S | U | U | U | 2 | 6 | 2 |
| 1 | D | S | U | U | D | D | S | U | U | D | 4 | 4 | 2 |
| 2 | D | S | U | D | D | D | S | U | D | D | 6 | 2 | 2 |
| 3 | D | S | U | U | U | D | D | D | D | D | 6 | 3 | 1 |
| 4 | D | S | U | U | D | D | D | D | D | D | 7 | 2 | 1 |
| 5 | D | S | U | D | D | D | D | D | D | D | 8 | 1 | 1 |
| 6 | D | S | U | U | U | D | S | U | U | D | 3 | 5 | 2 |

The special subframe may include a downlink pilot time slot (DwPTS), a guard period (GP), and an uplink pilot time slot (UpPTS). The DwPTS is an interval for a downlink resource in the special subframe and may be used for transmission of a physical downlink shared channel (PDSCH). The UpPTS is an interval for an uplink resource in the special subframe, and may be used for transmitting a sounding reference signal (SRS) or a physical random access channel (PRACH). The GP is an interval in which both downlink transmission and uplink transmission do not occur, and may be an interval required for downlink-uplink switching. The GP may be an interval positioned between the DwPTS and the UpPTS in one special subframe (e.g., 1 ms). Here, a combination of the DwPTS, the guard period, and the UpPTS included in one special subframe is referred to as a special subframe configuration (SSF configuration). Another SSF configuration indicates another combination of a length of the DwPTS, a length of the guard period, and a length of the UpPTS in one frame. In case that the wireless communication environment supports the LTE-TDD scheme, the SSF configuration may be operated as shown in Table 2 below. For example, SSF configuration #5 may indicate a combination in which the DwPTS occupies three (3) symbols, the guard period occupies nine (9) symbols, and the UpPTS occupies two (2) symbols, and SSF configuration #7 may indicate a combination in which the DwPTS occupies ten (10) symbols, the guard period occupies two (2) symbols, and the UpPTS occupies two (2) symbols.

TABLE 2

| SSF configuration | \multicolumn{14}{c}{Symbol number} |
|---|---|---|---|---|---|---|---|---|---|---|---|---|---|---|

| SSF configuration | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| 0 |   | Dw |   |   |   |   |   | GP |   |   |    |    |    | Up |
| 1 |   |   |   | Dw |   |   |   |   |   |   | GP |    |    | Up |
| 2 |   |   |   | Dw |   |   |   |   |   |   |    | GP |    | Up |
| 3 |   |   |   |   | Dw |   |   |   |   |   |    | GP |    | Up |
| 4 |   |   |   |   | Dw |   |   |   |   |   |    |    | GP | Up |
| 5 | Dw |   |   |   |   |   | GP |   |   |   |    |    |    | Up |
| 6 |   |   |   | Dw |   |   |   |   |   |   | GP |    |    | Up |
| 7 |   |   |   | Dw |   |   |   |   |   |   |    | GP |    | Up |
| 8 |   |   |   |   | Dw |   |   |   |   |   |    | GP |    | Up |
| 9 |   |   | Dw |   |   |   |   |   |   | GP |    |    |    | Up |

According to an embodiment, the base station 110 and the terminal 120 may use the TDD scheme of the NR. The TDD scheme of the NR may be configured more flexibly than the LTE TDD scheme. The TDD scheme of the NR defines a DL-UL pattern indicating a relationship between a DL time resource for the downlink communication and a UL time resource for the uplink communication. The DL-UL pattern may include a configuration periodicity, a DL time interval, and a UL time interval. The configuration periodicity may refer to a time in which one DL-UL pattern is applied. For example, the configuration periodicity may be one of 0.5 ms, 0.625 ms, 1 ms, 1.25 ms, 2.5 ms, 3 ms, 4 ms, 5 ms, and 10 ms. The DL time interval may be a time resource in which the downlink communication continues. The DL time interval may be expressed by the number of slots, may be expressed by the number of slots and the number of symbols, or only by the number of symbols. The DL time interval may be positioned at the beginning part in one configuration periodicity. The UL time interval may be a time resource in which the uplink communication continues. The UL time interval may be expressed by the number of slots, or may be expressed by the number of slots and the number of symbols, or only by the number of symbols. The UL time interval may be positioned at the end part in one configuration periodicity. A Slot other than a DL slot (a slot where all symbols are DL symbols) and a UL slot (a slot where all symbols are UL symbols) in one configuration periodicity may be a flexible slot. A downlink symbol, an uplink symbol, and a flexible symbol may also be distinguished in symbols (e.g., 14 symbols) of the slot. As an example of a resource structure of NR TDD, in case that a subcarrier spacing (SCS) is 15 kHz, 5 slots may be defined during a configuration periodicity of 5 ms. Among the five slots, the first 2 slots are the downlink slots, the last 2 slots are the uplink slots, and the middle slot may have the uplink symbols and the downlink symbols coexist. The first 5 symbols among the 14 symbols of the remaining slot may be the downlink symbols, the last 3 symbols among the 14 symbols may be the uplink symbols, and the remaining 6 symbols among the 14 symbols may be flexible symbols.

In the TDD scheme, since the same carrier frequency is used for the uplink transmission and the downlink transmission, it is necessary to distinguish between the DL time interval and the UL time interval. Thus, as described above, the resource structures for the TDD scheme may include the DL time interval and the UL time interval, and a remaining interval between the DL time interval and the UL time interval. For example, a transmission path is used in the DL time interval in which the base station 110 transmits a signal, but a reception path may not be used instead of the transmission path in the UL time interval in which the base station 110 receives a signal.

Figure 2:
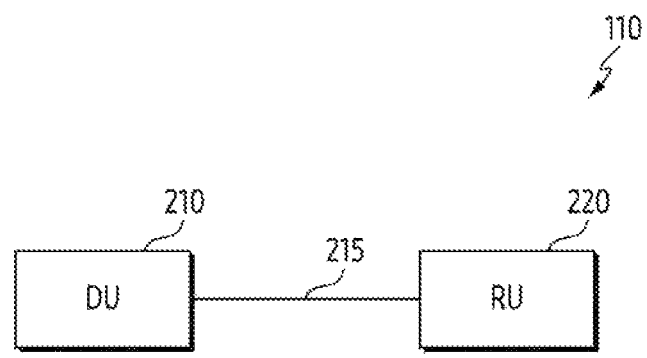
FIG. 2 illustrates an example of a fronthaul interface.

FIG. 2 illustrates an example of a fronthaul interface according to an embodiment. Unlike backhaul between a base station and a core network, the fronthaul refers to between entities between a wireless LAN and the base station.

In FIG. 2, an example of a fronthaul structure between a digital unit (DU) 210 and one radio unit (RU) 220 is illustrated. An embodiment of the disclosure may also be applied to a fronthaul structure between one DU and a plurality of RUs. For example, an embodiment of the disclosure may be applied to a fronthaul structure between one DU and 2 RUS. In addition, an embodiment of the disclosure may be applied to a fronthaul structure between one DU and 3 RUs.

Referring to FIG. 2, a base station 110 may include a DU 210 and an RU 220. A fronthaul 215 between the DU 210 and the RU 220 may be operated through a fronthaul interface. For operation of the fronthaul 215, for example, an interface such as enhanced common public radio interface (eCPRI) and radio over Ethernet (ROE) may be used.

As communication technology develops, mobile data traffic increases, and accordingly, a bandwidth requirement required by a fronthaul between a digital unit and a wireless unit greatly increases. In a deployment such as a centralized/cloud radio access network (C-RAN), the DU may be implemented to perform functions for packet data convergence protocol (PDCP), radio link control (RLC), media access control (MAC), and physical (PHY), and the RU may be implemented to further perform functions for the PHY layer in addition to a RF function.

The DU 210 may be in charge of an upper layer function of a wireless network. For example, the DU 210 may perform a function of the MAC layer and a portion of the PHY layer. Here, the portion of the PHY layer is performed at a higher level among the functions of the PHY layer, and for example, may include channel encoding (or channel decoding), scrambling (or descrambling), modulation (or demodulation), layer mapping (or layer demapping). According to one embodiment, in case that the DU 210 conforms to the O-RAN standard, it may be referred to as an O-RAN DU (O-DU). The DU 210 may be expressed by being replaced with a first network entity for the base station (e.g., gNB) in embodiments of the disclosure, if necessary.

The RU 220 may be in charge of a lower layer function of the wireless network. For example, the RU 220 may perform the portion of the PHY layer and an RF function. Here, the portion of the PHY layer is performed at a relatively lower level than the DU 210 among the functions of the PHY layer, and for example, may include iFFT conversion (or FFT conversion), CP insertion (CP removal), and digital beamforming. An example of such specific functional separation is described in detail in FIG. 4. The RU 220 may be referred to as 'access unit (AU), 'AP, 'TRP', 'remote radio head (RRH), 'RU' or another term having equivalent technical meaning thereto. According to an embodiment, in case that the RU 220 conforms to the O-RAN standard, it may be referred to as an O-RAN RU (O-RU). The RU 220 may be expressed by being replaced with a second network entity for the base station (e.g., gNB) in embodiments of the disclosure, if necessary.

FIG. 2 is described that the base station 110 includes the DU 210 and the RU 220, but embodiments of the disclosure are not limited thereto. The base station according to embodiments may be implemented as a centralized unit (CU) configured to perform the function of the upper layers of the access network (e.g., packet data convergence protocol (PDCP) and radio resource control (RRC)) and a distributed deployment according to a distributed unit (DU) configured to perform the function of the lower layer. In this case, the distributed unit (DU) may include the digital unit (DU) and the RU of FIG. 2. Between the core (e.g., 5G core (5GC) or next generation core (NGC) network and the radio network (RAN), the base station may be implemented in a structure in which they are disposed in the order of CU, DU, and RU. An interface between the CU and the distributed unit (DU) may be referred to as an F1 interface.

The centralized unit (CU) may be in charge of the function of an upper layer than the DU by being connected to one or more DUs. For example, the CU may be in charge of the function the radio resource control (RRC) and the packet data convergence protocol (PDCP) layer, and the DU and the RU may be in charge of the function of the lower layer. The DU may perform some functions (high PHY) of the radio link control (RLC), the media access control (MAC), and the physical (PHY) layer, and the RU may be in charge of the remaining functions (low PHY) of the PHY layer. In addition, for example, the digital unit (DU) may be included in the distributed unit (DU) depending on the implementation of the distributed deployment of the base station. Hereinafter, unless otherwise defined, it is described as a digital unit (DU) and RU operation, but one or more embodiments of this disclosure, one or more embodiments of the disclosure may be applied to both a base station deployment including the CU or a deployment (i.e., the CU and the DU are integrated and implemented as the base station (e.g., NG-RAN node), which is one entity) in which the DU is directly connected to the core network.

Hereinafter, in the disclosure, in an electronic device performing uplink transmission or downlink transmission through a TDD scheme, based on the maximum average power of a signal to be transmitted during a specific transmission interval, a structure for amplifying and transmitting the signal (hereinafter, a device and method for power amplification based on maximum average power for each transmission interval in the TDD) is described. The device and method for power amplification based on the maximum average power for each transmission interval in the TDD according to embodiments of the disclosure may identify the maximum average power of the signal to be transmitted during the specific transmission interval during a reception interval before the specific transmission interval and may change the characteristic of the power amplifier. Accordingly, the device and method for the power amplification based on the maximum average power for each transmission interval in the TDD may increase power efficiency of the power amplifier and may improve linearity.

Figure 3:
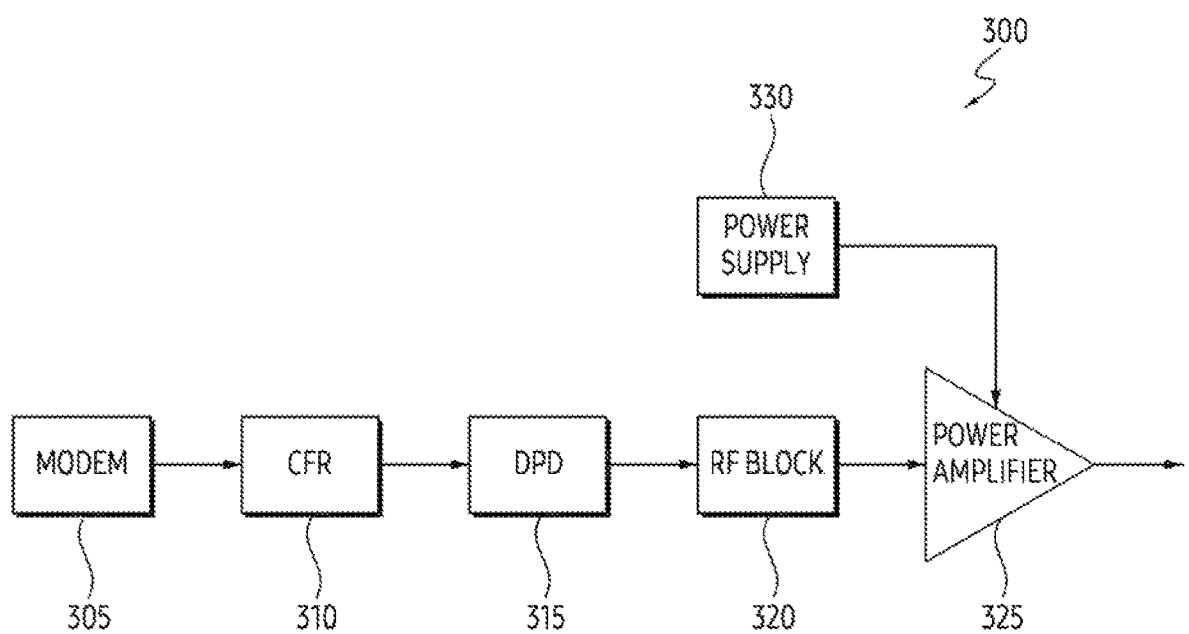
FIG. 3 illustrates an example of a transmission path of an electronic device.

FIG. 3 illustrates an example of a transmission path of an electronic device.

FIG. 3 illustrates an example of a transmission path for an electronic device 300 to generate a RF signal and transmit it to an external electronic device.

Referring to FIG. 3, the electronic device 300 may include a modem 305, a CFR module 310 (or CFR), a DPD module 315 (or DPD), a radio frequency (RF) block 320, a power amplifier 325, and a power supply 330. FIG. 3 illustrates the electronic device 300 exemplified as a simplified block diagram, but a structure of the electronic device 300 is not limited to the components of FIG. 3. For example, the electronic device 300 may also include a plurality of CFR modules 310, a plurality of DPD modules 315, a plurality of RF blocks 320, a plurality of power amplifiers 325, and a plurality of power supplies 330.

Referring to FIG. 3, the electronic device 300 may generate an RF signal and may transmit the generated RF signal to the external electronic device. For example, the electronic device 300 may generate a baseband signal through the modem 305. Generating the baseband signal may be referred to as generating a waveform. For example, the baseband signal may include in-phase/quadrature-phase (I/Q) data (or I/Q samples). The modem 305 may be included in a processor.

For example, the electronic device 300 may reduce a peak to average power ratio (PAPR) of the baseband signal generated through the modem 305 through the CFR module 310. For example, the CFR module 310 may process the baseband signal to have an optimal PAPR, in a range that satisfies a transmission restriction and condition of the electronic device 300.

For example, the CFR module 310 may perform a process of limiting a peak value of a signal based on a designated threshold. For example, the CFR module 310 may adjust the PAPR of the signal by performing clipping, peak windowing, noise shaping, pulse injection, or peak cancellation method on the baseband signal. For example, the clipping may indicate a method in which the CFR module 310 changes a portion of a signal corresponding to the designated threshold or more to the designated threshold. For example, the peak windowing may indicate a method in which the CFR module 310 changes the maximum value in the portion of the signal corresponding to the designated threshold or more to be equal to or less than the designated threshold while maintaining the waveform of the signal similar to the existing waveform. For example, the peak cancellation may indicate a method in which the CFR module 310 changes the portion of the signal to be equal to or less than the designated threshold while maintaining the waveform of the signal substantially the same in the remaining area except for the portion of the signal corresponding to the designated threshold or more.

For example, the electronic device 300 may compensate or improve the linearity of the power amplifier 325 through the DPD module 315. For example, the DPD module 315 may identify a signal outputted from the CFR module 310 and may apply inverse distortion (or predistortion) to the identified signal. Accordingly, the power amplifier 325 may output a linear signal by amplifying a nonlinear signal inversely distorted by the DPD module 315, unlike the output of the nonlinear signal in case that a signal that is not processed by the DPD module 315 is amplified. For example, the DPD module 315 may improve linearity based on at least one method of using a look-up table, Volterra series, memory polynomial, or designated algorithm.

For example, the electronic device 300 may upconvert a signal preprocessed through the DPD module 315 into the RF signal through the RF block 320. For example, the RF block 320 may include a digital to analog converter (DAC), a filter, a mixer, or a local oscillator. The RF block 320 may upconvert a signal outputted from the modem 305 and processed passed through the CFR module 310 and the DPD module 315 into a signal of a RF band.

For example, the electronic device 300 may amplify and output the signal of the RF band outputted through the RF block 320 through the power amplifier 325, and may transmit the outputted signal through a transmission antenna. The electronic device 300 may include the power supply 330 in order to supply a voltage necessary for driving the power amplifier 325. The power supply 330 may be connected to the power amplifier 325 and may supply a fixed voltage to the power amplifier 325. For example, the power supply 330 may supply a voltage corresponding to the maximum average power (or peak power) of the signal supplied to the power amplifier 325 as the fixed voltage. In other words, the power supply 330 may supply the voltage corresponding to the maximum average power as the fixed voltage, regardless of the average power of the signal supplied to the power amplifier 325.

For example, the characteristics of the power amplifier 325 may be changed depending on the power (e.g., DC voltage) supplied by the power supply 330. For example, in the power amplifier 325, a driving point of the power amplifier 325 may be changed depending on the supplied power, and thus, the characteristics of the power amplifier 325 may be changed. The power amplifier 325 may amplify and output the RF signal based on the characteristics of the power amplifier 325 and may transmit the outputted signal through the antenna.

Referring to the above, the baseband signal processed by the CFR module 310 and the DPD module 315 is converted into the RF signal through the RF block 320. The RF signal may be amplified while maintaining linearity through the power amplifier 325. However, since the voltage corresponding to the maximum average power is fixedly supplied to the power amplifier 325, the electronic device 300 may amplify the RF signal of an area having low average power based on an unnecessarily high voltage. Accordingly, in case that the power supply 330 supplies a fixed power, power efficiency of the power amplifier 325 may be reduced and power consumption may increase.

Figure 4:
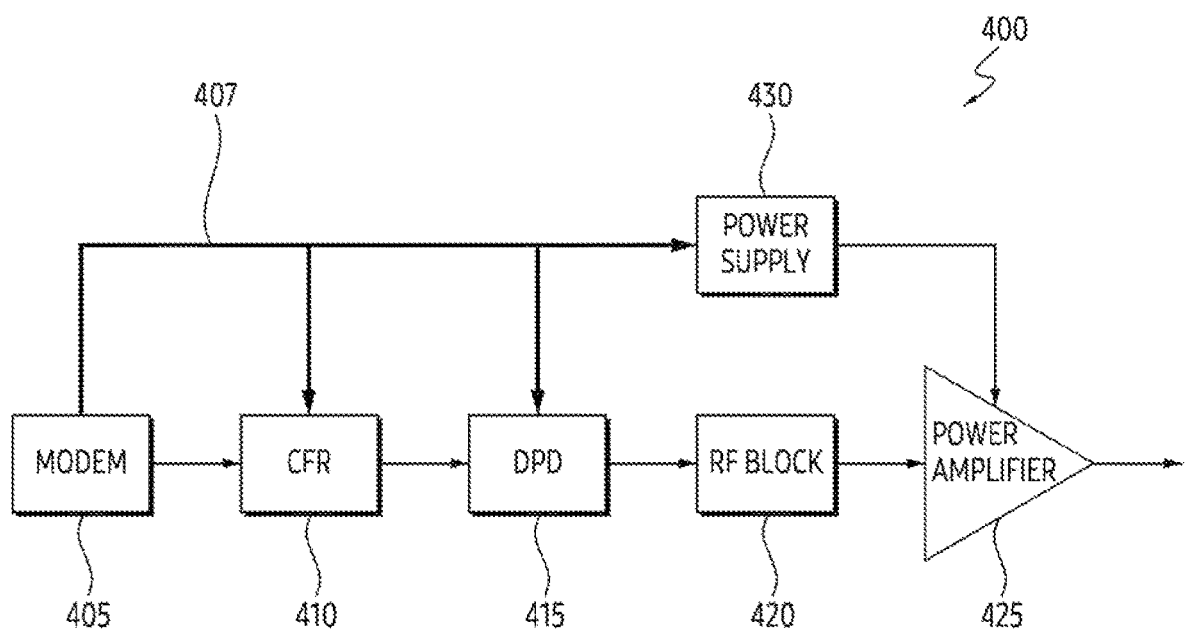
FIG. 4 illustrates an example of a transmission path of an electronic device for variably supplying voltage in a time division duplex (TDD) scheme.

FIG. 4 illustrates an example of a transmission path of an electronic device for variably supplying voltage in a TDD scheme.

FIG. 4 illustrates an example of the transmission path for generating a RF signal and transmitting it to an external electronic device. An electronic device 400 may represent an example of a base station 110 or a terminal 120 of FIG. 1A.

Referring to FIG. 4, the electronic device 400 may include a modem 405, a CFR module 410, a DPD module 415, a radio frequency block (RF block) 420, a power amplifier 425, and a power supply 430. FIG. 4 illustrates the electronic device 400 exemplified as a simplified block diagram, but a structure of the electronic device 400 is not limited to the components of FIG. 4. For example, the electronic device 400 may also include a plurality of CFR modules 410, a plurality of DPD modules 415, a plurality of RF blocks 420, a plurality of power amplifiers 425, and a plurality of power supplies 430.

Referring to FIG. 4, the electronic device 400 may generate an RF signal and may transmit the generated RF signal to the external electronic device. For example, the electronic device 400 may generate a baseband signal through the modem 405. Generating the baseband signal may be referred to as generating a waveform. For example, the baseband signal may include in-phase/quadrature-phase (I/Q) data (or I/Q samples). The modem 405 may be included in a processor.

For example, the electronic device 400 may reduce a peak to average power ratio (PAPR) of the baseband signal generated through the modem 405 through the CFR module 410. For example, the CFR module 410 may process the baseband signal to have an optimal PAPR, in a range that satisfies a transmission restriction and condition of the electronic device 400.

For example, the CFR module 410 may perform a process of limiting a peak value of a signal based on a designated threshold. For example, the CFR module 410 may adjust the PAPR of the signal by performing clipping, peak windowing, noise shaping, pulse injection, or peak cancellation method on the baseband signal. For example, the clipping may indicate a method in which the CFR module 410 changes a portion of a signal corresponding to the designated threshold or more to the designated threshold. For example, the peak windowing may indicate a method in which the CFR module 410 changes the maximum value in the portion of the signal corresponding to the designated threshold or more to be equal to or less than the designated threshold while maintaining the waveform of the signal similar to the existing waveform. For example, the peak cancellation may indicate a method in which CFR module 410 changes the portion of the signal to be equal to or less than the designated threshold while maintaining the waveform of the signal substantially the same in the remaining area except for the portion of the signal corresponding to the designated threshold or more.

For example, the electronic device 400 may compensate or improve the linearity of the power amplifier 425 through the DPD module 415. For example, the DPD module 415 may identify a signal outputted from the CFR module 410. The DPD 415 may apply predistortion to the identified signal. Accordingly, the power amplifier 425 may output a linear signal by amplifying a nonlinear signal predistorted by the DPD module 415, unlike the output of a non-linear signal in case that a signal that is not processed by the DPD module 415 is amplified. For example, the DPD module 415 improves linearity based on at least one method of using a look-up table, Volterra series, memory polynomial, or designated algorithm.

For example, the electronic device 400 may upconvert a signal preprocessed through the DPD module 415 into the RF signal through the RF block 420. For example, the RF block 420 may include a digital to analog converter (DAC), a filter, a mixer, or a local oscillator. The RF block 420 may upconvert a signal outputted from the modem 405 and processed passed through the CFR module 410 and the DPD module 415 into a signal of a RF band.

For example, the electronic device 400 may amplify and output the signal of the RF band outputted through the RF block 340 through the power amplifier 425, and may transmit the outputted signal through a transmission antenna. The electronic device 400 may include the power supply 430 in order to supply a voltage necessary for driving the power amplifier 425. The power supply 430 may be connected to the power amplifier 425. The power supply 430, unlike the power supply 330 of FIG. 3, may include a power supply that supplies variable power (e.g., DC voltage) to the power amplifier 425.

According to an embodiment, the modem 405 may be connected to the CFR module 410, the DPD module 415, and the power supply 430. For example, the modem 405 may be connected to the CFR module 410, the DPD module 415, and the power supply 430, and may provide a control signal 407 to each of the CFR module 410, the DPD module 415, and the power supply 430. The control signal 407 may include information for controlling the CFR module 410, the DPD module 415, and the power supply 430. For example, the control information may include information on the maximum average power of a signal transmitted in a transmission interval and information on the length of the transmission interval.

According to an embodiment, the control signal 407 may be provided from the modem 405 to the CFR module 410, the DPD module 415, and the variable power supply 430 in the reception interval between the previous transmission interval and the next transmission interval. For example, in the reception interval between the first transmission interval and the second transmission interval, which is the transmission interval after the first transmission interval, the modem 405 may provide the control signal 407 to the CFR module 410, the DPD module 415, and the variable power supply 430.

According to an embodiment, the information on the maximum average power may include information indicating a difference between a voltage corresponding to the maximum average power of a signal transmitted in a specific transmission interval and a voltage corresponding to the maximum average power of a signal to be transmitted in a transmission interval after the specific transmission interval. For example, the information on the maximum average power may include information indicating the difference between the voltage corresponding to the maximum average power of the first RF signal transmitted in the first transmission interval and the voltage corresponding to the maximum average power of the second RF signal to be transmitted in the second transmission interval after the first transmission interval. Alternatively, the information on the maximum average power may include information indicating a voltage value corresponding to the maximum average power of the signal to be transmitted in the transmission interval. For example, the information on the maximum average power, in the above example, may include information indicating a voltage value corresponding to the maximum average power of the second RF signal to be transmitted in the second transmission interval. In other words, the information on the maximum average power may include a difference (or amount of change) between the voltage of the signal transmitted in the previous transmission interval and the voltage value of the signal to be transmitted in the next transmission interval, or an absolute value of the voltage value of the signal to be transmitted in the next transmission interval.

According to an embodiment, the information on the maximum average power may be identified based on scheduling information. For example, a maximum average power for the first RF signal to be transmitted in the first transmission interval may be identified based on the first scheduling information. For example, a maximum average power for the second RF signal to be transmitted in the second transmission interval after the first transmission interval may be identified based on the second scheduling information.

According to an embodiment, the information on the maximum average power may be identified based on I/Q data included in the baseband signal. For example, the maximum average power for the first RF signal to be transmitted in the first transmission interval may be identified based on the first I/Q data. For example, the maximum average power for the second RF signal to be transmitted in the second transmission interval after the first transmission interval may be identified based on the second I/Q data.

According to an embodiment, in case that the electronic device 400 is the base station 110, the control information may be provided to a RU 220 from a DU 210 included in the base station 110. For example, the control information may be transmitted from the DU 210 to the RU 220 through a control plane message or a management plane message. For example, from the DU 210, control information including information on the maximum average power and information on the length of the transmission interval identified based on the scheduling information may be transmitted to the RU (220), and the RU 220 may amplify and transmit a signal based on the control information. The DU 210 may include the processor or the modem 405, and the RU 220 may include the power amplifier 425.

According to an embodiment, the CFR module 410, the DPD module 415, and the power supply 430 may change a state based on the control signal 407. For example, the CFR module 410, the DPD module 415, and the power supply 430 may change from a first state to a second state based on the control signal 407.

According to an embodiment, the CFR module 410 may change a threshold of the CFR module 410 as the first state is changed to the second state. For example, the CFR module 410 may set a threshold for adjusting the PAPR as a first value, in the first state. In case of changed to the second state by the control signal 407, the CFR module 410 may set the threshold for adjusting the PAPR as a second value. For example, in case that the maximum average power of the first state and the maximum average power of the second state are the same, the first value may be equal to the second value. For example, in case that the maximum average power of the first state is different from the maximum average power of the second state, the first value may be different from the second value.

According to an embodiment, the DPD module 415 may change a look-up table (LUT) of the DPD module 415 as the first state is changed to the second state. For example, the DPD module 415 may include a plurality of LUTs. In the first state, the DPD module 415 may set the LUT for applying the inverse distortion to a first LUT. In case of changed to the second state by the control signal 407, the DPD module 415 may set the LUT for applying the inverse distortion to a second LUT. For example, in case that the maximum average power of the first state is equal to the maximum average power of the second state, the first LUT may be equal to the second LUT. For example, in case that the maximum average power of the first state is different from the maximum average power of the second state, the first LUT may be different from the second LUT.

According to an embodiment, the power supply 430 may change the size of DC power supplied to the power amplifier 425 by the power supply 430 as the first state is changed to the second state. For example, the power supply 430 may provide a first DC voltage to the power amplifier 425 in the first state. In case of changed to the second state by the control signal 407, the power supply 430 may provide a second DC voltage to the power amplifier 425. For example, in case that the maximum average power of the first state is the same as the maximum average power of the second state, the first DC voltage may be equal to the second DC voltage. For example, in case that the maximum average power of the first state is different from the maximum average power of the second state, the first DC voltage may be different from the second DC voltage.

As described above, in case that the first state and the second state are different from each other, although it has been described that the first value and the second value, the first LUT and the second LUT, and the first DC voltage and the second DC voltage are different from each other, the embodiment of the disclosure is not limited thereto. For example, in case that the first state and the second state are different but substantially the same electrical state, the first value may be equal to the second value, the first LUT may be equal to the second LUT, and the first DC voltage may be equal to the second DC voltage.

According to an embodiment, the power amplifier 425 may differently amplify and output a signal as the first state is changed to the second state. For example, driving point of the power amplifier 425 may be changed as the magnitude of the DC voltage supplied from the power supply 430 is changed. In addition, the RF signal inputted to the power amplifier 425 can be generated by processing by the CFR module 410 and the DPD module 415 of the changed state. In other words, the supply DC voltage of the power supply 430 may be changed, in order to output power corresponding to the maximum average power identified based on the control signal 407. As the changed DC voltage is supplied, the settings of the CFR module 410 and the DPD module 415 may be changed, in order to generate the RF signal in consideration of the characteristics of the power amplifier 425 whose driving point has changed. The setting of the CFR module 410 and the DPD module 415 may be changed, in order to generate the RF signal having the maximum average power identified based on the control signal 407.

Referring to FIG. 3, an electronic device 300 may be amplified through a power amplifier 325 by converting a baseband signal processed by a CFR module 310 and a DPD module 315 into a RF signal through a RF block 320. However, since the voltage corresponding to the maximum average power is fixedly supplied to the power amplifier 325, the electronic device 300 may amplify an RF signal of an area having low average power based on an unnecessarily high voltage. In other words, since the power supply 330 supplies a fixed value of power (e.g., voltage) even though the average power changes depending on the amount of data of the transmitted RF signal, the power efficiency of the power amplifier 325 of the electronic device 300 may be reduced, and power consumption may be increased. In contrast, referring to FIG. 4, the electronic device 400 may efficiently amplify the signal by variably supplying power (e.g., DC voltage) to the power amplifier 425 and processing the signal to be inputted to the power amplifier 425 based on the maximum average power of the signal to be transmitted in the transmission interval. The electronic device 400 may output the amplified signal through the power amplifier 425 based on the maximum average power of the signal to be transmitted for each transmission interval, thereby improving the efficiency of power amplification and reducing power consumption. In addition, the electronic device 400 may maintain linearity by processing and generating a signal to correspond to the power amplifier 425 whose characteristics change according to the maximum average power.

Figure 5:
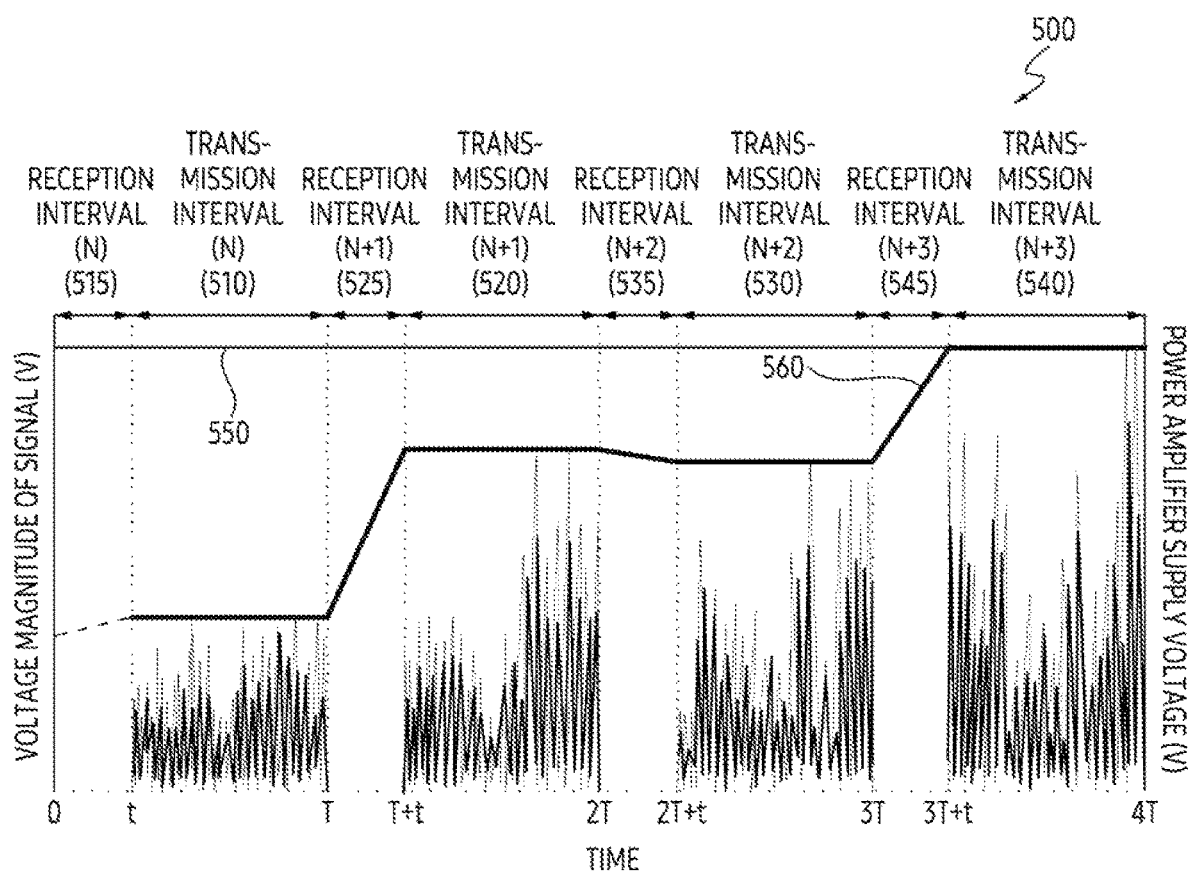
FIG. 5 is a graph indicating an example of a voltage variably supplied in a TDD scheme.

FIG. 5 is a graph indicating an example of a voltage variably supplied in a TDD scheme.

FIG. 5 illustrates an example of the voltage supplied to the power amplifier in case that an electronic device 300 of FIG. 3 and an electronic device 400 of FIG. 4 transmit and receive signals to and from an external electronic device by using a TDD. For example, the electronic device 300 of FIG. 3 or the electronic device 400 of FIG. 4 may include a base station or a terminal. The external electronic device may include the terminal or the base station.

Referring to FIG. 5, a graph 500 indicates the magnitude of the signal and the supply voltage over time. The horizontal axis of the graph 500 indicates time. The left vertical axis of the graph 500 indicates the voltage magnitude (unit: V) of the amplified and outputted signal, and the right vertical axis of the graph 500 indicates the magnitude (unit: V) of the voltage supplied to the power amplifier to amplify the signal.

The graph 500 illustrates lines indicating the voltage magnitude of the transmitted signal in transmission intervals 510, 520, 530, and 540. The graph 500 includes a first line 550 indicating a voltage supplied to the power amplifier (e.g., a power amplifier 325) of the electronic device 300 and a second line 560 indicating a voltage supplied to the power amplifier (e.g., a power amplifier 425) of the electronic device 400.

Referring to the graph 500, the electronic device 300 or the electronic device 400 may receive a signal from the external electronic device in reception intervals 515, 525, 535, and 545, and may transmit a signal to the external electronic device in the transmission intervals 510, 520, 530, and 540. The reception intervals 515, 525, 535, and 545 and the transmission intervals 510, 520, 530, and 540 may indicate time resources according to the TDD scheme. For example, in each of the transmission intervals 510, 520, 530, and 540, the electronic device 300 or the electronic device 400 may perform uplink transmission or downlink transmission. In each of the reception intervals 515, 525, 535, and 545, the electronic device 300 or the electronic device 400 may perform uplink reception or downlink reception.

For example, each of the reception interval 515 and the transmission interval 510, the reception interval 525 and the transmission interval 520, the reception interval 535 and the transmission interval 530, and the reception interval 545 and the transmission interval 540 may be included in the period interval T. For example, the reception interval 515 may indicates a time from 0 to t, the transmission interval 510 may indicate a time from t to T. For example, the reception interval 525 may indicate a time from T to T+t, and the transmission interval 520 may indicate a time from T+t to 2T. For example, the reception interval 535 may indicate a time from 2T to 2T+t, and the transmission interval 530 may indicate a time from 2T+t to 3T. For example, the reception interval 545 may indicate a time from 3T to 3T+t, and the transmission interval 540 may indicate a time from 3T+t to 4T.

In FIG. 5, a case in which the electronic device 300 or 400 transmits/receives with respect to periodically formed reception intervals 515, 525, 535, and 545 and transmission intervals 510, 520, 530, and 540 is exemplified, but the embodiment of the disclosure is not limited thereto. For example, an embodiment of the disclosure may include a case in which the electronic device 300 or 400 transmits/receives in aperiodically formed reception intervals and transmission intervals. In addition, in FIG. 5, a case in which the reception interval precedes the transmission interval is exemplified, but the embodiment of the disclosure is not limited thereto. For example, an embodiment of the disclosure may also include a case in which the transmission interval precedes the reception interval.

Referring to the first line 550, the electronic device 300 may provide the power amplifier with the supply voltage corresponding to a value in which the voltage magnitude of the transmission signal is maximum (or maximum average power) in the transmission intervals 510, 520, 530, and 540.

For example, the electronic device 300 may provide the power amplifier through the power supply with the supply voltage that makes the voltage magnitude of the transmission signal maximize regardless of the reception intervals 515, 525, 535, and 545 and the transmission intervals 510, 520, 530, and 540. In this case, the CFR module and the DPD module may be set to correspond to characteristics of the power amplifier identified according to the supply voltage.

Referring to the second line 560, the electronic device 400 may provide the power amplifier with the supply voltage corresponding to a value in which the voltage magnitude of the transmission signal is maximum (or maximum average power) for each of the transmission intervals 510, 520, 530, and 540. According to an embodiment, the electronic device 400 may provide the power amplifier with a first supply voltage corresponding to the value in which the voltage magnitude of the transmission signal is maximum (or maximum average power) in the Nth transmission interval 510. The first supply voltage may indicate the magnitude of the supply voltage indicated by a portion of the second line 560 corresponding to the Nth transmission interval 510. For example, the power supply of the electronic device 400 may supply the first supply voltage to the power amplifier.

According to an embodiment, the electronic device 400 may identify voltage information (e.g., maximum voltage magnitude or maximum average power) of a signal to be transmitted in the N+1th transmission interval 520. For example, the electronic device 400 may identify the maximum voltage magnitude (or maximum average power) of the signal to be transmitted in the N+1th transmission period 520 based on scheduling information or I/Q data. For example, the electronic device 400 may identify the maximum voltage magnitude of the signal to be transmitted in the N+1th transmission interval 520 while transmitting the signal in the Nth transmission interval 510. Alternatively, the electronic device 400 may identify the maximum voltage magnitude of the signal to be transmitted in the N+1th transmission interval 520 before the N+1th transmission interval 520. Alternatively, the electronic device 400 may identify the maximum voltage magnitude of the signal to be transmitted in the N+1th transmission interval 520 in the N+1th reception interval 525.

According to an embodiment, the electronic device 400 may change the state of the CFR module, the DPD module, and the power supply, in the N+1th reception interval 525, based on the identified maximum voltage magnitude (or maximum average power). For example, the electronic device 400 may change the state of the CFR module, the DPD module, and the power supply, through a control signal identified based on the maximum voltage magnitude identified in the N+1th reception interval 525. The change of the state may include a change of the magnitude of the supply voltage indicated by the portion of the second line 560 corresponding to the N+1th reception interval 525. For example, the change of the state may include changing the magnitude of power supplied by the power supply from the first supply voltage to the second supply voltage. The second supply voltage may indicate the magnitude of the supply voltage indicated by the portion of the second line 560 corresponding to the N+1th transmission interval 520. For example, the second supply voltage may have a higher value than the first supply voltage, and the change of the state may include that the magnitude of supplied power is increased(or boosted). In addition, the change of the state may include changing a threshold for the PAPR of the CFR module and the LUT for applying an inverse distortion of the DPD module to correspond to characteristics of the power amplifier to be changed according to the second supply voltage. The threshold for the PAPR may indicate a threshold for adjusting the maximum signal magnitude. The LUT for applying the inverse distortion may indicate a LUT for compensating for nonlinear characteristics.

According to an embodiment, the electronic device 400 may provide the second supply voltage corresponding to a value in which the voltage magnitude of the transmission signal is maximum (or maximum average power) in the N+1th transmission interval 520. For example, the power supply of the electronic device 400 may supply the second supply voltage to the power amplifier. The electronic device 400 may transmit a signal amplified through the power amplifier based on the second supply voltage.

According to an embodiment, the electronic device 400 may provide the changed second supply voltage based on the I/Q data of the transmitted signal while transmitting the signal amplified through the second supply voltage in the N+1th transmission interval 520. For example, the electronic device 400 may identify the I/Q data of the signal and may transmit the amplified signal through the changed second supply voltage based on the identified I/Q data, even while transmitting the signal based on the second supply voltage identified in the N+1th reception interval 525, in the N+1th transmission interval 520.

According to an embodiment, the electronic device 400 may identify voltage information (e.g., maximum voltage magnitude or maximum average power) of a signal to be transmitted in the N+2th transmission interval 530, in the N+2th reception interval 535. For example, the electronic device 400 may identify the maximum voltage magnitude (or maximum average power) of the signal to be transmitted in the N+2th transmission interval 530, based on the scheduling information or the I/Q data. For example, the electronic device 400 may identify the maximum voltage magnitude of the signal to be transmitted in the N+2th transmission interval 530 while transmitting the signal in the N+1th transmission interval 520. Alternatively, the electronic device 400 may identify the maximum voltage magnitude of the signal to be transmitted in the N+2th transmission interval 530, before the N+2th transmission interval 530. Alternatively, the electronic device 400 may identify the maximum voltage magnitude of the signal to be transmitted in the N+2th transmission interval 530, in the N+2th reception interval 535.

According to an embodiment, the electronic device 400 may change the state of the CFR module, the DPD module, and the power supply, in the N+2th reception interval 535, based on the identified maximum voltage magnitude (or maximum average power). For example, the electronic device 400 may change the state of the CFR module, the DPD module, and the power supply, through a control signal identified based on the maximum voltage magnitude identified in the N+2th reception interval 535. The change of the state may include a change of the magnitude of the supply voltage indicated by the portion of the second line 560 corresponding to the N+2th reception interval 535. For example, the change of the state may include changing the magnitude of power supplied by the power supply from the second supply voltage to the third supply voltage. The third supply voltage may indicate the magnitude of the supply voltage indicated by the portion of the second line 560 corresponding to the N+2th transmission interval 530. For example, the third supply voltage may have a lower value than the second supply voltage, and the change of the state may include that the magnitude of supplied power is reduced. In addition, the change of the state may include changing the threshold for the PAPR of the CFR module and the LUT for applying the inverse distortion of the DPD module to correspond to characteristics of the power amplifier to be changed according to the third supply voltage. The threshold for the PAPR may indicate a threshold for adjusting the maximum signal magnitude. The LUT for applying the inverse distortion may indicate a LUT for compensating for nonlinear characteristics.

According to an embodiment, the electronic device 400 may provide the third supply voltage corresponding to a value in which the voltage magnitude of the transmission signal is maximum (or maximum average power) in the N+2th transmission interval 530, to the power amplifier. For example, the power supply of the electronic device 400 may supply the third supply voltage to the power amplifier. The electronic device 400 may transmit a signal amplified through the power amplifier based on the third supply voltage.

According to an embodiment, the electronic device 400 may provide the changed third supply voltage based on the I/Q data of the transmitted signal while transmitting the signal amplified through the third supply voltage in the N+2th transmission interval 530. For example, the electronic device 400 may identify the I/Q data of the signal and may transmit the amplified signal through the changed third supply voltage based on the identified I/Q data, even while transmitting the signal based on the third supply voltage identified in the N+2th reception interval 535, in the N+2th transmission interval 530.

According to an embodiment, the electronic device 400 may identify voltage information (e.g., maximum voltage magnitude or maximum average power) of a signal to be transmitted in the N+3th transmission interval 540, in the N+3th reception interval 545. For example, the electronic device 400 may identify the maximum voltage magnitude (or maximum average power) of the signal to be transmitted in the N+3th transmission interval 540, based on the scheduling information or the I/Q data. For example, the electronic device 400 may identify the maximum voltage magnitude of the signal to be transmitted in the N+3th transmission interval 540 while transmitting the signal in the N+2th transmission interval 530. Alternatively, the electronic device 400 may identify the maximum voltage magnitude of the signal to be transmitted in the N+3th transmission interval 540, before the N+3th transmission interval 540. Alternatively, the electronic device 400 may identify the maximum voltage magnitude of the signal to be transmitted in the N+3th transmission interval 540, in the N+3th reception interval 545.

According to an embodiment, the electronic device 400 may change the state of the CFR module, the DPD module, and the power supply, in the N+3th reception interval 545, based on the identified maximum voltage magnitude (or maximum average power). For example, the electronic device 400 may change the state of the CFR module, the DPD module, and the power supply, through a control signal identified based on the maximum voltage magnitude identified in the N+3th reception interval 545. The change of the state may include a change of the magnitude of the supply voltage indicated by the portion of the second line 560 corresponding to the N+3th reception interval 545. For example, the change of the state may include changing the magnitude of power supplied by the power supply from the third supply voltage to the fourth supply voltage. The fourth supply voltage may indicate the magnitude of the supply voltage indicated by the portion of the second line 560 corresponding to the N+3th transmission interval 540. For example, the fourth supply voltage may have a higher value than the third supply voltage, and the change of the state may include that the magnitude of supplied power is increased (boosted). In addition, the change of the state may include changing the threshold for the PAPR of the CFR module and the LUT for applying the inverse distortion of the DPD module to correspond to characteristics of the power amplifier to be changed according to the fourth supply voltage. The threshold for the PAPR may indicate a threshold for adjusting the maximum signal magnitude. The LUT for applying the inverse distortion may indicate a LUT for compensating for nonlinear characteristics.

According to an embodiment, the electronic device 400 may provide the fourth supply voltage corresponding to a value in which the voltage magnitude of the transmission signal is maximum (or maximum average power) in the N+3th transmission interval 540, to the power amplifier. For example, the power supply of the electronic device 400 may supply the fourth supply voltage to the power amplifier. The electronic device 400 may transmit a signal amplified through the power amplifier based on the fourth supply voltage.

According to an embodiment, the electronic device 400 may provide the changed fourth supply voltage based on the I/Q data of the transmitted signal while transmitting the signal amplified through the fourth supply voltage in the N+3th transmission interval 540. For example, the electronic device 400 may identify the I/Q data of the signal and may transmit the amplified signal through the changed fourth supply voltage based on the identified I/Q data, even while transmitting the signal based on the fourth supply voltage identified in the N+3th reception interval 545, in the N+3th transmission interval 540.

Referring to FIG. 5, the device and the method for power amplification based on the maximum average power for each transmission interval in the TDD according to embodiments of the disclosure may change the states of components (e.g., the CFR module, the DPD module, and the power supply) included in the transmission path while reducing the impact on the transmission or reception performance of the electronic device by using the TDD in which the transmission interval and the reception interval are distinguished. For example, the device and the method for power amplification based on the maximum average power for each transmission interval in the TDD according to embodiments of the disclosure may change the state for transmission in the reception interval just before the transmission interval based on information on the maximum average power of the signal to be transmitted in the transmission interval. The device and the method for power amplification based on the maximum average power for each transmission interval in the TDD according to embodiments of the disclosure may output a signal amplified through the power amplifier based on the maximum average power of the signal to be transmitted for each transmission interval, thereby improving efficiency of power amplification and reducing power consumption. In addition, the device and the method for power amplification based on the maximum average power for each transmission interval in the TDD according to embodiments of the disclosure may maintain linearity by processing and generating the signal to correspond to the power amplifier whose characteristics change according to the maximum average power.

Figure 6:
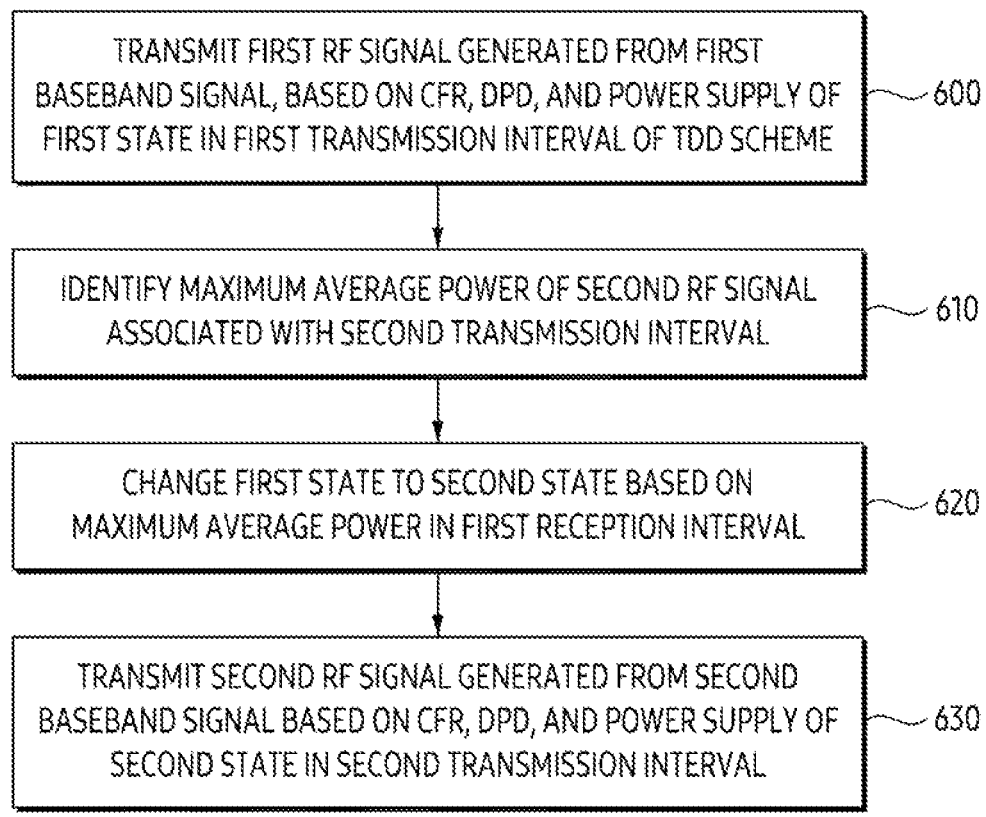
FIG. 6 illustrates an example of an operation flow of an electronic device for amplifying a transmission signal based on a variable voltage in a TDD scheme.

FIG. 6 illustrates an example of an operation flow of an electronic device for amplifying a transmission signal based on a variable voltage in a TDD scheme.

A method of FIG. 6 may be performed by an electronic device 400 of FIG. 4. For example, the method of FIG. 6 may be performed by a processor of the electronic device 400 of FIG. 4. The processor may include a modem 405 of FIG. 4. The method of FIG. 6 shows an example in which the electronic device 400 uses the TDD scheme when transmitting and receiving a signal to and from an external electronic device.

The following transmission interval and reception interval may indicate a resource interval (or a time interval (hereinafter, referred to as a time interval) in which a frequency band is allocated) for the TDD scheme. For example, in case that the electronic device 400 is a base station, the transmission interval may indicate a resource interval for downlink transmission, and the reception interval may indicate a resource interval for uplink reception. Alternatively, in case that the electronic device 400 is a terminal, the transmission interval may indicate a resource interval for uplink transmission, and the reception interval may indicate a resource interval for downlink reception. Hereinafter, the transmission interval and the reception interval may be alternately allocated, as illustrated in an example 150 of FIG. 1B.

Referring to FIG. 6, in operation 600, the electronic device 400 may, based on a first state of each of a CFR module, a DPD module, and a power supply transmit a first RF signal (generated from a first baseband signal). For example, the electronic device 400 may generate the first RF signal by processing the first baseband signal generated from the modem through the CFR module and the DPD module of the first state and by upconverting it through an RF block. According to an embodiment, the processor may amplify and transmit the first RF signal through a power amplifier operating according to power supplied based on the power supply of the first state. The CFR module, the DPD module, and the power supply of the first state may include the CFR module in which a threshold for adjusting a PAPR is a first value, the DPD module in which a first LUT is set among a plurality of LUTs, and the power supply in which a DC voltage for supplying to the power amplifier is a first voltage value.

In operation 610, the electronic device 400 may identify the maximum average power of a second RF signal associated with a second transmission interval. For example, the electronic device 400 may identify voltage information (e.g., maximum voltage magnitude or maximum average power) of the second RF signal associated with the second transmission interval. The second transmission interval is a transmission interval after the first transmission interval, and may indicate a time interval after the first reception interval. The first reception interval may indicate a time interval between the first transmission interval and the second transmission interval.

For example, the electronic device 400 may identify the maximum voltage magnitude (or maximum average power) of the second RF signal to be transmitted in the second transmission interval while transmitting the first RF signal in the first transmission interval. Alternatively, the electronic device 400 may identify the maximum voltage magnitude (or maximum average power) of the second RF signal to be transmitted in the second transmission interval before the second transmission interval. Alternatively, the electronic device 400 may identify the maximum voltage magnitude of the second RF signal to be transmitted in the second transmission interval in the first reception interval.

In operation 620, the electronic device 400 may change the first state to a second state based on the maximum average power of the second RF signal. For example, the electronic device 400 may change the states of the CFR module, the DPD module, and the power supply from the first state to the second state in order to generate and transmit the second RF signal according to the maximum average power in the first reception interval. The CFR, the DPD module, and the power supply of the second state may include the CFR module in which the threshold for adjusting the PAPR is a second value, the DPD module in which a second LUT is set among a plurality of LUTs, and the power supply in which the DC voltage for supplying to the power amplifier is a second voltage value. The second value set in the CFR module of the second state may be different from the first value set in the CFR module of the first state. The second LUT set in the DPD module of the second state may be different from the first LUT set in the DPD module of the first state. The second voltage value set in the power supply of the second state may be different from the first voltage value set in the power supply of the first state.

According to an embodiment, the electronic device 400 may identify a control signal for changing from the first state to the second state. For example, the control information may include information on the maximum average power of the second RF signal to be transmitted in the second transmission interval and information on a length of the second transmission interval. For example, information on the maximum average power may include information indicating the difference between the voltage corresponding to the maximum average power of the first RF signal transmitted in the first transmission interval and the voltage corresponding to the maximum average power of the second RF signal to be transmitted in the second transmission interval after the first transmission interval. Alternatively, the information on the maximum average power may include information indicating a voltage value corresponding to the maximum average power of the second RF signal to be transmitted in the second transmission interval. In other words, the information on the maximum average power may include a difference (or amount of change) between the voltage of the first RF signal transmitted in the first transmission interval and the voltage value of the second RF signal to be transmitted in the second transmission interval, or an absolute value of the voltage value of the second RF signal to be transmitted in the second transmission interval.

According to an embodiment, the information on the maximum average power may be identified based on scheduling information. For example, the maximum average power for the first RF signal to be transmitted in the first transmission interval may be identified based on the first scheduling information. For example, the maximum average power for the second RF signal to be transmitted in the second transmission interval after the first transmission interval may be identified based on the second scheduling information.

According to an embodiment, the information on the maximum average power may be identified based on I/Q data included in the baseband signal. For example, the maximum average power for the first RF signal to be transmitted in the first transmission interval may be identified based on the first I/Q data. For example, the maximum average power for the second RF signal to be transmitted in the second transmission interval after the first transmission interval may be identified based on the second I/Q data.

According to an embodiment, the control signal for changing from the first state to the second state may be provided from the modem (or processor) to the CFR module, the DPD module, and the variable power supply in the first reception interval between the first transmission interval and the second transmission interval. In the first reception interval between the first transmission interval and the second transmission interval, which is the transmission interval after the first transmission interval, the processor may provide the control signal to the CFR module, the DPD module, and the variable power supply.

According to an embodiment, in case that the electronic device 400 is the base station, the control information may be provided from a DU (e.g., a DU 210 of FIG. 2) included in the base station to an RU (e.g., an RU 220 of FIG. 2). For example, the control information may be transmitted from the DU to the RU through a control plane message or a management plane message. For example, from the DU, the control information including information on the maximum average power identified based on the scheduling information and information on the length of the transmission interval may be transmitted to the RU, the RU may amplify and transmit the signal based on the control information. The DU may include the processor (or modem (e.g., the modem 405 of FIG. 4)), and the RU may include the power amplifier (e.g., a power amplifier 425 of FIG. 4).

According to an embodiment, the electronic device 400 may change a threshold of the CFR module as the first state is changed to the second state. For example, in the first state, the electronic device 400 may set a threshold for adjusting the PAPR of the CFR module as the first value. In case of changed to the second state by the control information, the electronic device 400 may set the threshold for adjusting the PAPR of the CFR module to the second value.

According to an embodiment, the electronic device 400 may change a look-up table (LUT) of the DPD module as the first state is changed to the second state. For example, the DPD module may include a plurality of LUTs. In the first state, the electronic device 400 may set the LUT for applying the inverse distortion of the DPD module as the first LUT. In case of changed to the second state by the control information, the electronic device 400 may set the LUT for applying the inverse distortion of the DPD module as the second LUT.

According to an embodiment, the electronic device 400 may change the size of the DC power supplied by the power supply to the power amplifier as the first state is changed to the second state. For example, in the first state, the electronic device 400 may set the supply power of the power supply provided to the power amplifier as the first DC voltage. In case of changed to the second state by the control information, the electronic device 400 may set the supply power of the power supply provided to the power amplifier as the second DC voltage.

In operation 630, the electronic device 400 may transmit the second RF signal generated from a second baseband signal based on the CFR module, the DPD module, and the power supply of the second state in the second transmission interval. For example, the electronic device 400 may generate the second RF signal by processing the second baseband signal generated from the modem through the CFR module and the DPD module of the second state and by upconverting it through the RF block. According to an embodiment, the electronic device 400 may amplify and transmit the second RF signal through the power amplifier operating according to the power supplied based on the power supply of the second state.

According to an embodiment, the electronic device 400 may set the power amplifier to amplify and output a signal as the first state is changed to the second state. For example, the magnitude of the DC voltage supplied from the power supply is changed, so that the driving point of the power amplifier may be changed. In addition, the RF signal inputted to the power amplifier may be generated by processing by the CFR module and the DPD module of the second state. In other words, the supply DC voltage of the power supply may be changed, in order to output power corresponding to the maximum average power identified based on the control information. As the changed DC voltage is supplied, the settings of the CFR module and the DPD module may be changed, in order to generate the RF signal in consideration of the characteristics of the power amplifier whose driving point is changed. The settings of the CFR module and the DPD module may be changed, in order to generate the second RF signal having the maximum average power identified based on the control information.

According to an embodiment, the electronic device 400 may change the supply voltage based on the I/Q data of the transmitted second RF signal, while, based on the second state of each of the CFR module, the DPD module, and the power supply, transmitting the second RF signal in the second transmission interval. For example, the electronic device 400 may identify the I/Q data of the second RF signal and may transmit the amplified second RF signal through the changed supply voltage based on the identified I/Q data, even while, based on the supply voltage identified in the first reception interval, transmitting the second RF signal in the second transmission interval.

In FIG. 6, according to an embodiment, the electronic device 400 may identify the maximum average power of the third RF signal associated with the third transmission interval after the second transmission interval, in the second reception interval after the second transmission interval. According to an embodiment, the electronic device 400 may change from the second state to the third state based on the maximum average power of the third RF signal. For example, the processor may change the states of the CFR module, the DPD module, and the power supply from the second state to the third state. According to an embodiment, the electronic device 400 may transmit the third RF signal generated from a third baseband signal based on the CFR module, the DPD module, and the power supply of the third state, in the third transmission interval.

According to an embodiment, the electronic device 400 may transmit an uplink signal or a downlink signal aperiodically. For example, a length of the first reception interval and the second transmission interval may be set differently from a length of the second reception interval and the third transmission interval.

According to an embodiment, the electronic device 400 may identify the control signal for changing the state, in a reception interval having a different time interval length. For example, in order to transmit the second RF signal of the second transmission interval, the electronic device 400 may identify the control signal in the first reception interval having a first length and may control to change the state. In addition, in order to transmit the third RF signal of the third transmission interval, the electronic device 400 may identify the control signal in the second reception interval having a second length and may control to change a state. The first length may be set differently from the second length.

Referring to FIG. 6, the device and the method for power amplification based on the maximum average power for each transmission interval in the TDD according to embodiments of the disclosure may change the states of components (e.g., the CFR module, the DPD module, and the power supply) included in the transmission path while reducing the impact on the transmission or reception performance of the electronic device by using the TDD in which the transmission interval and the reception interval are distinguished. For example, the device and the method for power amplification based on the maximum average power for each transmission interval in the TDD according to embodiments of the disclosure may change the state for transmission in the reception interval just before the transmission interval based on information on the maximum average power of the signal to be transmitted in the transmission interval. The device and the method for power amplification based on the maximum average power for each transmission interval in the TDD according to embodiments of the disclosure may output a signal amplified through the power amplifier based on the maximum average power of the signal to be transmitted for each transmission interval, thereby improving efficiency of power amplification and reducing power consumption. In addition, the device and the method for power amplification based on the maximum average power for each transmission interval in the TDD according to embodiments of the disclosure may maintain linearity by processing and generating the signal to correspond to the power amplifier whose characteristics change according to the maximum average power.

Figure 7:
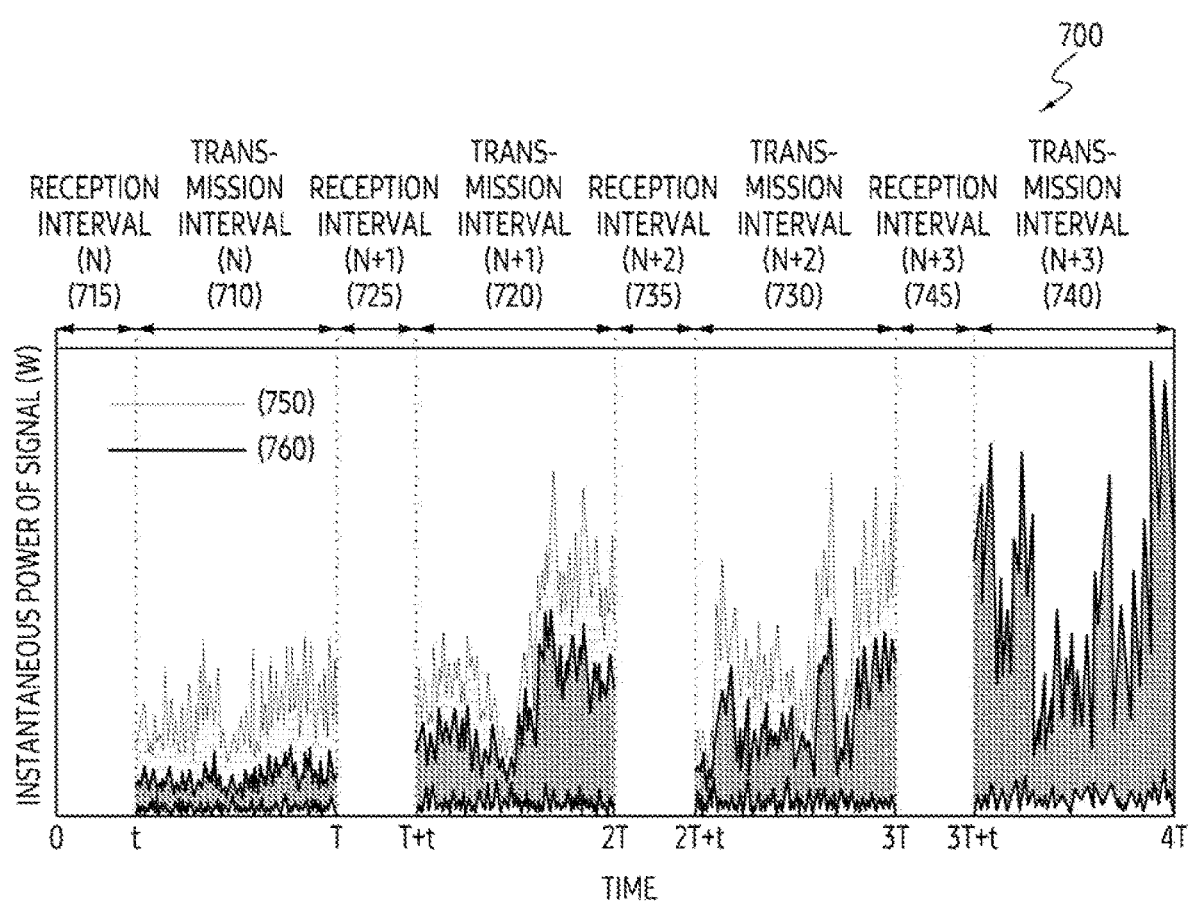
FIG. 7 is a graph indicating an example of instantaneous power consumed by an electronic device based on a voltage variably supplied in a TDD scheme.

FIG. 7 is a graph indicating an example of instantaneous power consumed by an electronic device based on a voltage variably supplied in a TDD scheme.

FIG. 7 illustrates an example in which an electronic device 300 of FIG. 3 and an electronic device 400 of FIG. 4 transmit a signal to an external electronic device by using the TDD. For example, the electronic device 300 of FIG. 3 or the electronic device 400 of FIG. 4 may include a base station or a terminal. The external electronic device may include the terminal or the base station.

A graph 700 of FIG. 7 includes a first line 750 indicating the instantaneous power of the signal transmitted by the electronic device 300 to the external electronic device over time and a second line 760 indicating the instantaneous power of the signal transmitted by the electronic device 400 to the external electronic device over time. The horizontal axis of the graph 700 indicates time, and the vertical axis indicates the instantaneous power (unit: W) of the signal consumed by the electronic device 300 or 400.

Referring to the graph 700, the electronic device 300 or the electronic device 400 may receive the signal from the external electronic device in reception intervals 715, 725, 735, and 745 and may transmit the signal to the external electronic device in transmission intervals 710, 720, 730, and 740. The reception intervals 715, 725, 735, and 745 and the transmission intervals 710, 720, 730, and 740 may indicate time resources according to the TDD scheme. For example, in each of the transmission intervals 710, 720, 730, and 740, the electronic device 300 or the electronic device 400 may perform uplink transmission or downlink transmission. In each of the reception sections 715, 725, 735, and 745, the electronic device 300 or the electronic device 400 may perform uplink reception or downlink reception.

For example, each of the reception interval 715 and the transmission interval 710, the reception interval 725 and the transmission interval 720, the reception interval 735 and the transmission interval 730, the reception interval 745 and the transmission interval 740 may be included in the period interval T. For example, the reception interval 715 may indicate a time from 0 to t, and the transmission interval 710 may indicate a time from t to T. For example, the reception interval 725 may indicate a time from T to T+t, and the transmission interval 720 may indicate a time from T+t to 2T. For example, the reception interval 735 may indicate a time from 2T to 2T+t, and the transmission interval 730 may indicate a time from 2T+t to 3T. For example, the reception interval 745 may indicate a time from 3T to 3T+t, and the transmission interval 740 may indicate a time from 3T+t to 4T.

In FIG. 7, a case in which the electronic device 300 or 400 transmits/receives with respect to periodically formed reception intervals 715, 725, 735, and 745 and transmission intervals 710, 720, 730, and 740 is exemplified, but the embodiment of the disclosure is not limited thereto. For example, an embodiment of the disclosure may include a case in which the electronic device 300 or 400 transmits/receives in aperiodically formed reception intervals and transmission intervals. In addition, in FIG. 7, a case in which the reception interval precedes the transmission interval is exemplified, but the embodiment of the disclosure is not limited thereto. For example, an embodiment of the disclosure may also include a case in which the transmission interval precedes the reception interval.

Comparing the first line 750 and the second line 760, in the transmission interval 710, the transmission interval 720, and the transmission interval 730, power consumed when the electronic device 400 transmits the signal may be lower than power consumed when the electronic device 300 transmits the signal. For example, the electronic device 400 may change the state of components (e.g., a CFR 410, a DPD 415, and a power supply 430) of the electronic device 400 based on the maximum average power of the signal transmitted in each transmission intervals 710, 720, and 730, so that the instantaneous power of the signal consumed compared to the electronic device 300 may be reduced. In addition, in the transmission interval 740, the power consumed when the electronic device 400 transmits the signal may be substantially the same as the power consumed when the electronic device 300 transmits the signal. For example, since the maximum average power of the signal transmitted in the transmission interval 740 is the same as the maximum average power in all transmission intervals 710, 720, 730, and 740, the electronic device 400 may have substantially the same instantaneous power of the signal consumed as that of the electronic device 300.

Referring to the above, the device and the method for power amplification based on the maximum average power for each transmission interval in the TDD according to embodiments of the disclosure may be formed with low instantaneous power of the signal in the remaining interval except for the transmission interval including the maximum average power in the entire transmission intervals. The device and the method for power amplification based on the maximum average power for each transmission interval in the TDD according to embodiments of the disclosure may be formed with lower instantaneous power than in case of amplifying the signal based on the voltage value corresponding to the maximum average power in the entire transmission interval, since the signal is amplified based on the voltage value corresponding to the maximum average power for each transmission interval. Accordingly, the device and the method for power amplification based on the maximum average power for each transmission interval in the TDD according to embodiments of the disclosure may improve the efficiency of power amplification and may reduce power consumption. In addition, the device and the method for power amplification based on the maximum average power for each transmission interval in the TDD according to embodiments of the disclosure may maintain linearity by controlling other components (e.g., CFR, DPD) in consideration of the characteristics of the power amplifier that is changed according to the voltage value.

Figure 8:
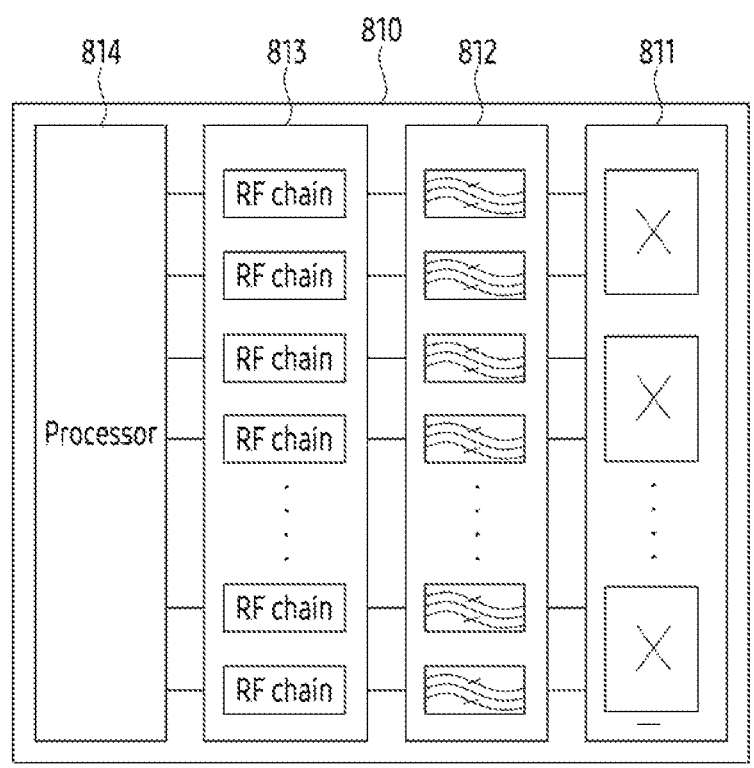
FIG. 8 illustrates an example of a functional configuration of an electronic device.

FIG. 8 illustrates an example of a functional configuration of an electronic device according to an embodiment. An electronic device 810 may be one of a base station or a terminal. In case that the electronic device 810 is the base station, the electronic device 810 may include a DU (e.g., a DU 210 of FIG. 2) and an RU (e.g., an RU 220 of FIG. 2). According to an embodiment, the electronic device 810 may be an MMU or an mmWave device. Not only the transmission structure that supplies the variable voltage mentioned through FIGS. 1A to 7, but also the structure of a RF chain including the same and an electronic device including the same are also included in embodiments of the disclosure.

Referring to FIG. 8, an exemplary functional configuration of the electronic device 810 is illustrated. The electronic device 810 may include an antenna unit 811, a filter unit 812, a RF processing unit 813, and a control unit 814.

The antenna unit 811 may include multiple antennas. The antenna performs functions for transmitting and receiving a signal through a wireless channel. The antenna may include a conductor formed on a substrate (e.g., an antenna PCB, an antenna board) or a radiator formed of a conductive pattern. The antenna may radiate the up-converted signal on the wireless channel or may obtain a signal radiated by another device. Each antenna may be referred to as an antenna element or an antenna element. In some embodiments, the antenna unit 811 may include an antenna array (e.g., a sub array) in which a plurality of antenna elements form an array. The antenna unit 811 may be electrically connected to the filter unit 812 through RF signal lines. The antenna unit 811 may be mounted on the PCB including multiple antenna elements. The PCB may include a plurality of RF signal lines connecting each antenna element and a filter of the filter unit 812. These RF signal lines may be referred to as a feeding network. The antenna unit 811 may provide the received signal to the filter unit 812 or may radiate the signal provided from the filter unit 812 into the air.

The antenna unit 811 according to one or more embodiments may include at least one antenna module having a dual polarization antenna. The dual polarization antenna may be, for example, a cross-pole (x-pole) antenna. The dual polarization antenna may include two antenna elements corresponding to different polarization. For example, the dual polarization antenna may include a first antenna element having a polarization of +45° and a second antenna element having a polarization of −45°. It goes without saying that the polarization may be formed with other polarizations that are orthogonal other than +45° and −45°. Each antenna element may be connected to a feeding line and may be electrically connected to the filter unit 812, the RF processing unit 813, and the control unit 814 to be described later.

The dual polarization antenna may be a patch antenna (or microstrip antenna). The dual polarization antenna may be easily implemented and integrated into an array antenna, by having the form of the patch antenna. Two signals having different polarizations may be inputted to each antenna port. Each antenna port corresponds to the antenna element. For high efficiency, it is required to optimize the relationship between the co-pol characteristic and the cross-pol characteristic between two signals with different polarizations. In the dual polarization antenna, the co-pol characteristic indicates a characteristic for a specific polarization component, and the cross-pol characteristic indicates a characteristic for a polarization component different from the specific polarization component.

The filter unit 812 may perform filtering to transmit a signal of a desired frequency. The filter unit 812 may perform a function for selectively identifying a frequency by forming resonance. In some embodiments, the filter unit 812 may form the resonance through a cavity that structurally includes a dielectric. In addition, in some embodiments, the filter unit 812 may form the resonance through elements forming inductance or capacitance. In addition, in some embodiments, the filter unit 812 may include an elastic filter such as a bulk acoustic wave (BAW) filter or a surface acoustic wave (SAW) filter. The filter unit 812 may include at least one of a band pass filter, a low pass filter, a high pass filter, or a band reject filter. In other words, the filter unit 812 may include RF circuits for obtaining a signal of a frequency band for transmission or a frequency band for reception. The filter unit 812 according to one or more embodiments may electrically connect the antenna unit 811 and the RF processing unit 813.

The RF processing unit 813 may include a plurality of RF paths. The RF path may be a unit of a path through which a signal received through an antenna or a signal radiated through an antenna passes. At least one RF path may be referred to as an RF chain. The RF chain may include a plurality of RF elements. The RF elements may include an amplifier, a mixer, an oscillator, a DAC, an ADC, and the like. For example, the RF processing unit 813 may include an up converter that up-converts a digital transmission signal of a base band to a transmission frequency, and a digital-to-analog converter (DAC) that converts the up-converted digital transmission signal into an analog RF transmission signal. The up converter and DAC form a portion of a transmission path. The transmission path may further include a power amplifier (PA) or coupler (or combiner). In addition, for example, the RF processing unit 813 may include an analog-to-digital converter (ADC) that converts an analog RF reception signal into a digital reception signal and a down converter that converts the digital reception signal into a digital reception signal of the base band. The ADC and the down converter form a portion of a reception path. The reception path may further include a low-noise amplifier (LNA) or a coupler (or divider). RF components of the RF processing unit may be implemented on the PCB. The electronic device 810 may include a structure stacked in the order of the antenna unit 811—the filter unit 812—the RF processing unit 813. The antennas and the RF components of the RF processing unit may be implemented on the PCB, and may form a plurality of layers by being repeatedly fastened filters between the PCBs. A CFR 410, a DPD 415, a RF block 420, a power amplifier 425 and a power supply 430 of an electronic device 400 according to embodiments of the disclosure may be included in the RF processing unit 813.

The control unit 814 may control overall operations of the electronic device 810. The control unit 814 may include various modules for performing communication. The control unit 814 may include at least one processor such as a modem. The control unit 814 may include modules for digital signal processing. For example, the control unit 814 may include the modem. When transmitting data, the control unit 814 generates complex symbols by encoding and modulating the transmission bit string. In addition, for example, when receiving data, the control unit 814 restores the reception bit string by demodulating and decoding the baseband signal. The control unit 814 may perform functions of a protocol stack required by a communication standard. A modem 405 of the electronic device 400 according to embodiments of the disclosure may be included in the control unit 814.

In FIG. 8, the functional configuration of the electronic device 810 has been described. However, the example illustrated in FIG. 8 is only an exemplary configuration for utilizing the device and the method for power amplification based on the maximum average power for each transmission interval in TDD according to the embodiments of the disclosure described through FIG. 1A to FIG. 7, and the embodiments of the disclosure are not limited to the components of the equipment illustrated in FIG. 8. Thus, one configuration of communication equipment including a transmission structure for power amplification based on the maximum average power for each transmission interval in the TDD according to embodiments of the disclosure and communication equipment including the same may also be understood as the embodiment of the disclosure.

Referring to the above, the device and the method for power amplification based on the maximum average power for each transmission interval in the TDD according to embodiments of the disclosure may amplify the signal efficiently, by variably supplying power (e.g., DC voltage) to the power amplifier and processing the signal to be inputted to the power amplifier, based on the maximum average power of the signal to be transmitted in the transmission interval. The device and the method for power amplification based on the maximum average power for each transmission interval in the TDD according to embodiments of the disclosure may output the signal amplified through the power amplifier based on the maximum average power of the signal to be transmitted for each transmission interval, thereby improving efficiency of power amplification and reducing power consumption. In addition, the device and the method for power amplification based on the maximum average power for each transmission interval in the TDD according to embodiments of the disclosure may maintain linearity by processing and generating the signal to correspond to the power steam whose characteristics change according to the maximum average power.

As mentioned above, an electronic device may comprise a processor. The electronic device may comprise a power amplifier. The electronic device may comprise a power supply for the power amplifier. The electronic device may comprise a CFR module. The electronic device may comprise a DPD module. The processor may be configured to transmit a first RF signal generated from a first baseband signal based on a first state of the CFR module, the DPD module, and the power supply, in a first transmission interval of TDD scheme. The processor may be configured to identify voltage information of a second RF signal associated with a second transmission interval after the first transmission interval. The processor may be configured to, based on the voltage information, change a state of the CFR module, the DPD module, and the power supply from the first state to a second state, in a first reception interval between the first transmission interval and the second transmission interval. The processor may be configured to transmit the second RF signal generated from a second baseband signal based on the second state of the CFR module, the DPD module, and the power supply, in the second transmission interval.

According to an embodiment, the processor may be configured to identify a control signal for changing from the first state to the second state. The processor may be configured to change the state of the CFR module, the DPD module, and the power supply based on the control signal. The control signal includes information on a voltage corresponding to a maximum average power of the first RF signal and a voltage corresponding to a maximum average power of the second RF signal, and length information of the second transmission interval.

According to an embodiment, the processor may be configured to identify first scheduling information for transmitting the first RF signal. The processor may be configured to identify second scheduling information for transmitting the second RF signal. The maximum average power of the first RF signal is identified based on the first scheduling information. The maximum average power of the second RF signal is identified based on the second scheduling information.

According to an embodiment, the electronic device may comprise a DU and a RU. The control information is provided from the DU to the RU.

According to an embodiment, the processor may be configured to identify a first in-phase/quadrature-phase (I/Q) data included in the first baseband signal. The processor may be configured to identify a second I/Q data included in the second baseband signal. The maximum average power of the first RF signal is identified based on the first I/Q data. The maximum average power of the second RF signal is identified based on the second I/Q data.

According to an embodiment, the processor may be configured to identify another voltage information of a third RF signal associated with a third transmission interval after the second transmission interval. The processor may be configured to change the state of the CFR module, the DPD module, and the power supply from the second state to a third state, based on the another voltage information of the third RF signal, in a second reception interval between the second transmission interval and the third transmission interval. The processor may be configured to transmit the third RF signal generated from a third baseband signal based on the third state of the CFR module, the DPD module, and the power supply, in the third transmission interval. A length of the first reception interval and the second transmission interval is different from a length of the second reception interval and the third transmission interval.

According to an embodiment, the processor may be configured to set a threshold of the CFR module in the first state to a first value. The processor may be configured to set the threshold of the CFR module in the second state to a second value based on the voltage information of the second RF signal.

According to an embodiment, the DPD module includes a plurality of look-up table (LUT)s. The processor may be configured to set a LUT of the DPD module in the first state to a first LUT of the plurality of LUTs. The processor may be configured to set the LUT of the DPD module in the second state to a second LUT of the plurality of LUTs based on the voltage information of the second RF signal.

According to an embodiment, the processor may be configured to set a direct current supplied by the power supply in the first state to a first voltage. The processor may be configured to set the direct current supplied by the power supply in the second state to a second voltage based on the voltage information of the second RF signal.

According to an embodiment, the processor may be configured to transmit the first RF signal by amplifying using the power amplifier corresponding to the first state. The processor may be configured to transmit the second RF signal by amplifying using the power amplifier corresponding to the second state.

As mentioned above, a method performed by an electronic device may comprise transmitting a first RF signal generated from a first baseband signal based on a first state of a CFR, a DPD, and a power supply for a power amplifier of the electronic device, in a first transmission interval of TDD scheme. The method comprises identifying voltage information of a second RF signal associated with a second transmission interval after the first transmission interval. The method may comprise, based on the voltage information, changing a state of the CFR module, the DPD module, and the power supply from the first state to a second state, in a first reception interval between the first transmission interval and the second transmission interval. The method may comprise transmitting the second RF signal generated from a second baseband signal based on the second state of the CFR module, the DPD module, and the power supply, in the second transmission interval.

According to an embodiment, the method may comprise identifying a control signal for changing from the first state to the second state. The method may comprise changing the state of the CFR module, the DPD module, and the power supply based on the control signal. The control signal includes information on a voltage corresponding to a maximum average power of the first RF signal and a voltage corresponding to a maximum average power of the second RF signal, and length information of the second transmission interval.

According to an embodiment, the method may comprise identifying first scheduling information for transmitting the first RF signal. The method may comprise identifying second scheduling information for transmitting the second RF signal. The maximum average power of the first RF signal is identified based on the first scheduling information. The maximum average power of the second RF signal is identified based on the second scheduling information.

According to an embodiment, the electronic device may comprise a DU and a RU. The control information is provided from the DU to the RU.

According to an embodiment, the method may comprise identifying a first in-phase/quadrature-phase (I/Q) data included in the first baseband signal. The method may comprise identifying a second I/Q data included in the second baseband signal. The maximum average power of the first RF signal is identified based on the first I/Q data. The maximum average power of the second RF signal is identified based on the second I/Q data.

According to an embodiment, the method may comprise identifying another voltage information of a third RF signal associated with a third transmission interval after the second transmission interval. The method may comprise changing the state of the CFR module, the DPD module, and the power supply from the second state to a third state, based on the another voltage information of the third RF signal, in a second reception interval between the second transmission interval and the third transmission interval. The method may comprise transmitting the third RF signal generated from a third baseband signal based on the third state of the CFR module, the DPD module, and the power supply, in the third transmission interval. A length of the first reception interval and the second transmission interval is different from a length of the second reception interval and the third transmission interval.

According to an embodiment, the method may comprise setting a threshold of the CFR module in the first state to a first value. The method may comprise setting the threshold of the CFR module in the second state to a second value based on the voltage information of the second RF signal.

According to an embodiment, the DPD module includes a plurality of look-up table (LUT)s. The method may comprise setting a LUT of the DPD module in the first state to a first LUT of the plurality of LUTs. The method may comprise setting the LUT of the DPD module in the second state to a second LUT of the plurality of LUTs based on the voltage information of the second RF signal.

According to an embodiment, the method may comprise setting a direct current voltage supplied by the power supply in the first state to a first voltage. The method may comprise setting the direct current voltage supplied by the power supply in the second state to a second voltage based on the voltage information of the second RF signal.

According to an embodiment, the method may comprise transmitting the first RF signal by amplifying using the power amplifier corresponding to the first state. The method may comprise transmitting the second RF signal by amplifying using the power amplifier corresponding to the second state.

Methods according to the embodiments described in the claims or the specification of the disclosure may be implemented in the form of hardware, software, or a combination of hardware and software.

When implemented as software, a computer-readable storage medium storing one or more program (software module) may be provided. The one or more program stored in the computer-readable storage medium is configured for execution by one or more processor in the electronic device. The one or more programs include instructions that cause the electronic device to execute methods according to embodiments described in the claim or the specification of the disclosure.

Such program (software modules, software) may be stored in random access memory, non-volatile memory including flash memory, read only memory (ROM), electrically erasable programmable read only memory (EEPROM), magnetic disc storage device, compact disc-ROM (CD-ROM), digital versatile disc (DVD) or other form of optical storage, magnetic cassette. Alternatively, it may be stored in a memory configured with some or all combinations thereof. In addition, each configuration memory may be included a plurality.

In addition, the program may be stored in an attachable storage device that may be accessed through a communication network, such as the Internet, Intranet, local area network (LAN), wide area network (WAN), or storage area network (SAN), or a combination thereof. Such a storage device may be connected to a device performing an embodiment of the disclosure through an external port. In addition, a separate storage device on the communication network may access a device performing an embodiment of the disclosure.

In the above-described specific embodiments of the disclosure, the component included in the disclosure is expressed in singular or plural according to the presented specific embodiment. However, singular or plural expression is chosen appropriately for the situation presented, and the disclosure is not limited to singular or plural component, and even if the component is expressed in plural, it may be configured with singular, or even if it is expressed in singular, it may be configured with plural.

In the detailed description of the disclosure, specific embodiments have been described, but it goes without saying that various modifications are possible without departing from the scope of the disclosure.

What is claimed is:
1. An electronic device comprising:
a processor;
a power amplifier;

a power supply configured to supply power to the power amplifier;
a crest factor reduction (CFR) module; and
a digital predistortion (DPD) module,
wherein the processor is configured to:
    transmit a first radio frequency (RF) signal, by providing a first supply voltage to the power amplifier based on a first state of each of the CFR module, the DPD module, and the power supply, in a first transmission interval of a time division duplex (TDD) scheme, the first RF signal being generated from a first baseband signal;
    identify voltage information of a second RF signal to be transmitted in a second transmission interval of the TDD scheme after the first transmission interval of the TDD scheme;
    change a state of each of the CFR module, the DPD module, and the power supply from the first state to a second state, based on the voltage information, in a first reception interval of the TDD scheme between the first transmission interval of the TDD scheme and the second transmission interval of the TDD scheme; and
    transmit the second RF signal generated from a second baseband signal by providing a second supply voltage to the power amplifier based on the second state of each of the CFR module, the DPD module, and the power supply, in the second transmission interval.

2. The electronic device of claim 1, wherein the processor is further configured to:
    identify a control signal for changing from the first state to the second state;
    transmit the control signal to each of the CFR module, the DPD module, and the power supply during the first reception interval; and
    based on the control signal, change a state of the CFR module, a state of the DPD module, and a state of the power supply, and
    wherein the control signal comprises:
        information on the first supply voltage corresponding to a maximum average power of the first RF signal and the second supply voltage corresponding to a maximum average power of the second RF signal, and
        length information of the second transmission interval.

3. The electronic device of claim 2, wherein the processor is further configured to:
    identify first scheduling information for transmitting the first RF signal, and
    identify second scheduling information for transmitting the second RF signal,
    wherein the maximum average power of the first RF signal is identified based on the first scheduling information, and
    wherein the maximum average power of the second RF signal is identified based on the second scheduling information.

4. The electronic device of claim 2, wherein the processor is further configured to:
    identify a first in-phase/quadrature-phase (I/Q) data in the first baseband signal, and
    identify a second I/Q data in the second baseband signal,
    wherein the maximum average power of the first RF signal is identified based on the first I/Q data, and
    wherein the maximum average power of the second RF signal is identified based on the second I/Q data.

5. The electronic device of claim 1, wherein the voltage information of the second RF signal comprises a maximum average power of the second RF signal, and
    wherein the maximum average power of the second RF signal corresponds to a maximum voltage of the second RF signal during the second transmission interval, for providing the second supply voltage to the power amplifier.

6. The electronic device of claim 1, wherein the processor is further configured to:
    identify another voltage information of a third RF signal to be transmitted in a third transmission interval of the TDD scheme after the second transmission interval,
    change the state of each of the CFR module, the DPD module, and the power supply from the second state to a third state, based on the other voltage information of the third RF signal, in a second reception interval of the TDD scheme between the second transmission interval and the third transmission interval, and
    transmit the third RF signal, by providing a third supply voltage to the power amplifier based on the third state of each of the CFR module, the DPD module, and the power supply, in the third transmission interval, the third RF signal being generated from a third baseband signal,
    wherein a length of the first reception interval and the second transmission interval is different from a length of the second reception interval and the third transmission interval.

7. The electronic device of claim 1, wherein the processor is further configured to:
    set a threshold of the CFR module in the first state to a first value; and
    set the threshold of the CFR module in the second state to a second value based on the voltage information of the second RF signal.

8. The electronic device of claim 1, wherein the DPD module comprises a plurality of look-up table (LUT)s,
    wherein the processor is further configured to:
        set a LUT of the DPD module in the first state to a first LUT of the plurality of LUTs, and
        set the LUT of the DPD module in the second state to a second LUT of the plurality of LUTs based on the voltage information of the second RF signal.

9. The electronic device of claim 1, wherein the processor is further configured to:
    set a direct current voltage supplied by the power supply in the first state to the first supply voltage, and
    set the direct current voltage supplied by the power supply in the second state to the second supply voltage based on the voltage information of the second RF signal.

10. The electronic device of claim 1, wherein the processor is further configured to:
    transmit the first RF signal by amplifying using the power amplifier corresponding to the first state, and
    transmit the second RF signal by amplifying using the power amplifier corresponding to the second state.

11. A method performed by an electronic device, the method comprising:
    transmitting a first radio frequency (RF) signal, by providing a first supply voltage to a power amplifier of the electronic device based on a first state of each of a crest factor reduction (CFR) module, a digital predistortion (DPD) module, and a power supply for the power amplifier, in a first transmission interval of a time division duplex (TDD) scheme, the first RF signal being generated from a first baseband signal;

identifying voltage information of a second RF signal to be transmitted in a second transmission interval of the TDD scheme after the first transmission interval of the TDD scheme;

changing a state of each of the CFR module, the DPD module, and the power supply from the first state to a second state, based on the voltage information of the second RF signal, in a first reception interval of the TDD scheme between the first transmission interval of the TDD scheme and the second transmission interval of the TDD scheme; and transmitting the second RF signal, by providing a second supply voltage to the power amplifier based on the second state of each of the CFR module, the DPD module, and the power supply, in the second transmission interval of the TDD scheme, the second RF signal being generated from a second baseband signal.

12. The method of claim 11, further comprising:

identifying a control signal for changing from the first state to the second state;

transmitting the control signal to each of the CFR module, the DPD module, and the power supply during the first reception interval; and changing a state of the CFR module, a state of the DPD module, and a state of the power supply based on the control signal, and wherein the control signal comprises:
information on the first supply voltage corresponding to a first maximum average power of the first RF signal and the second supply voltage corresponding to a second maximum average power of the second RF signal, and
length information of the second transmission interval of the TDD scheme.

13. The method of claim 12, further comprising:

identifying first scheduling information for transmitting the first RF signal, and identifying second scheduling information for transmitting the second RF signal, wherein the maximum average power of the first RF signal is identified based on the first scheduling information, and wherein the maximum average power of the second RF signal is identified based on the second scheduling information.

14. The method of claim 12, further comprising:

identifying a first in-phase/quadrature-phase (I/Q) data in the first baseband signal, and identifying a second I/Q data in the second baseband signal, wherein the maximum average power of the first RF signal is identified based on the first I/Q data, and wherein the maximum average power of the second RF signal is identified based on the second I/Q data.

15. The method of claim 11, wherein the voltage information of the second RF signal comprises a maximum average power of the second RF signal, and wherein the maximum average power of the second RF signal corresponds to a maximum voltage of the second RF signal during the second transmission interval of the TDD scheme, for providing the second supply voltage to the power amplifier.

16. The method of claim 11, further comprising:

identifying another voltage information of a third RF signal to be transmitted in—a third transmission interval of the TDD scheme after the second transmission interval of the TDD scheme, changing the state of each of the CFR module, the DPD module, and the power supply from the second state to a third state, based on the other voltage information of the third RF signal, in a second reception interval of the TDD scheme between the second transmission interval of the TDD scheme and the third transmission interval of the TDD scheme, and transmitting the third RF signal, by providing a third supply voltage to the power amplifier based on the third state of each of the CFR module, the DPD module, and the power supply, in the third transmission interval of the TDD scheme, the third RF signal being generated from a third baseband signal, wherein a length of the first reception interval and the second transmission interval of the TDD scheme is different from a length of the second reception interval and the third transmission interval of the TDD scheme.

17. The method of claim 11, further comprising:

setting a threshold of the CFR module in the first state to a first value; and setting the threshold of the CFR module in the second state to a second value based on the voltage information of the second RF signal.

18. The method of claim 11, wherein the DPD module comprises a plurality of look-up table (LUT)s, wherein the method further comprises:
setting a LUT of the DPD module in the first state to a first LUT of the plurality of LUTs, and
setting the LUT of the DPD module in the second state to a second LUT of the plurality of LUTs based on the voltage information of the second RF signal.

19. The method of claim 11, further comprising:

setting a direct current voltage supplied by the power supply in the first state to the first supply voltage, and setting the direct current voltage supplied by the power supply in the second state to the second supply voltage based on the voltage information of the second RF signal.

20. The method of claim 11, further comprising:

transmitting the first RF signal by amplifying using the power amplifier corresponding to the first state, and transmitting the second RF signal by amplifying using the power amplifier corresponding to the second state.

* * * * *